(12) United States Patent
Tokioka et al.

(10) Patent No.: US 9,929,294 B2
(45) Date of Patent: Mar. 27, 2018

(54) PHOTOELECTRIC CONVERSION DEVICE, MANUFACTURING METHOD THEREOF, AND PHOTOELECTRIC CONVERSION MODULE

(71) Applicants: Hidetada Tokioka, Tokyo (JP); Takehiko Sato, Tokyo (JP)

(72) Inventors: Hidetada Tokioka, Tokyo (JP); Takehiko Sato, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 508 days.

(21) Appl. No.: 14/373,759

(22) PCT Filed: Jan. 31, 2013

(86) PCT No.: PCT/JP2013/052230
§ 371 (c)(1),
(2) Date: Jul. 22, 2014

(87) PCT Pub. No.: WO2013/172056
PCT Pub. Date: Nov. 21, 2013

(65) Prior Publication Data
US 2015/0007867 A1    Jan. 8, 2015

(30) Foreign Application Priority Data
May 14, 2012   (JP) ................. 2012-110838

(51) Int. Cl.
*H01L 31/042*   (2014.01)
*H01L 31/0352*  (2006.01)
(Continued)

(52) U.S. Cl.
CPC ........... *H01L 31/035272* (2013.01); *H01L 31/02167* (2013.01); *H01L 31/022441* (2013.01);
(Continued)

(58) Field of Classification Search
CPC ..... H01L 31/022441; H01L 31/035272; H01L 31/02167; H01L 31/0682
(Continued)

(56) References Cited

U.S. PATENT DOCUMENTS

2005/0022857 A1* 2/2005 Daroczi ............. H01L 31/0516
                                                        136/244
2010/0087031 A1* 4/2010 Veschetti ............ H01L 31/0745
                                                          438/72
(Continued)

FOREIGN PATENT DOCUMENTS

JP       2005 5376       1/2005
JP       2005 12108      1/2005
(Continued)

OTHER PUBLICATIONS

International Search Report dated May 14, 2013 in PCT/JP13/052230 Filed Jan. 31, 2013.

*Primary Examiner* — Niki Bakhtiari
(74) *Attorney, Agent, or Firm* — Oblon, McClelland, Maier & Neustadt, L.L.P.

(57) ABSTRACT

A photoelectric conversion device includes an n-type semiconductor layer and a p-type semiconductor layer, a collecting electrode formed on the n-type semiconductor layer, and a collecting electrode formed on the p-type semiconductor layer, on a back surface opposite to a light receiving surface of an n-type crystalline silicon substrate, and an n-type semiconductor region on a surface on a light receiving surface side of the n-type crystalline silicon substrate, wherein in the n-type semiconductor region, an n-type semiconductor region that is opposed to the n-type semiconductor layer with the n-type crystalline silicon substrate therebetween and an n-type semiconductor region that is opposed to the p-type semiconductor layer with the n-type (Continued)

crystalline silicon substrate therebetween have different average impurity concentrations.

13 Claims, 25 Drawing Sheets

(51) Int. Cl.
- *H01L 31/0216* (2014.01)
- *H01L 31/0224* (2006.01)
- *H01L 31/068* (2012.01)
- *H01L 31/18* (2006.01)

(52) U.S. Cl.
CPC ...... *H01L 31/0682* (2013.01); *H01L 31/1804* (2013.01); *H01L 31/1824* (2013.01); *Y02E 10/547* (2013.01); *Y02P 70/521* (2015.11)

(58) Field of Classification Search
USPC .................................................. 136/243–265
See application file for complete search history.

(56) References Cited

U.S. PATENT DOCUMENTS

| | | | |
|---|---|---|---|
| 2010/0263722 A1 | 10/2010 | Kubo et al. | |
| 2011/0139231 A1* | 6/2011 | Meier | H01L 31/02363 136/255 |
| 2014/0311563 A1* | 10/2014 | Jaffrennou | H01L 31/02168 136/256 |

FOREIGN PATENT DOCUMENTS

| | | |
|---|---|---|
| JP | 2005 101427 | 4/2005 |
| JP | 2010 123859 | 6/2010 |
| JP | 2010 129872 | 6/2010 |
| JP | 2010 147324 | 7/2010 |
| JP | 2010 258043 | 11/2010 |
| JP | 2011 35092 | 2/2011 |

* cited by examiner

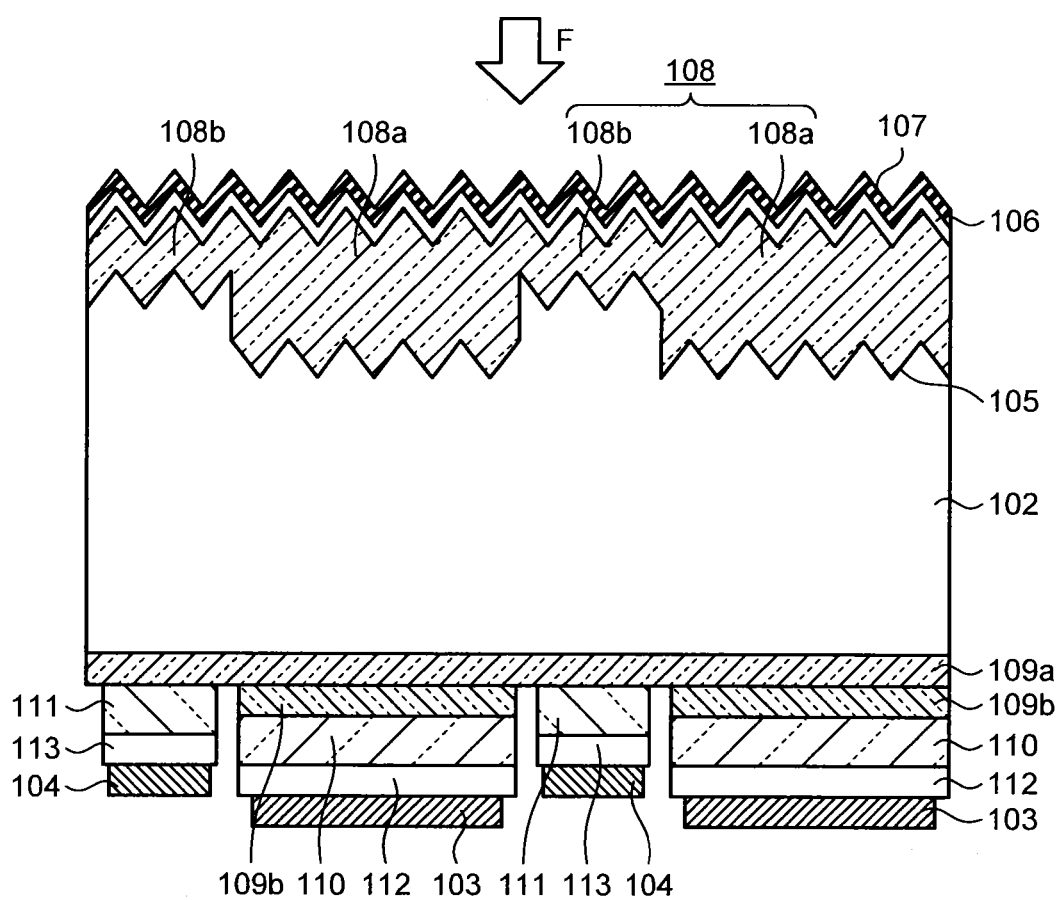

PHOTOELECTRIC CONVERSION DEVICE, MANUFACTURING METHOD THEREOF, AND PHOTOELECTRIC CONVERSION MODULE

FIELD

The present invention relates to a photoelectric conversion device, a manufacturing method thereof, and a photoelectric conversion module, and particularly to a photoelectric conversion device in which a p-type semiconductor electrode and an n-type semiconductor electrode are arranged on a back surface side opposite to a light receiving surface, a manufacturing method thereof, and a photoelectric conversion module.

BACKGROUND

An example of a conventional photoelectric conversion device includes a solar cell in which a boron (B)-doped p-type semiconductor layer and a collecting electrode patterned into a thin shape on the p-type semiconductor layer are formed, in the order they appear in this sentence, on one surface side of the crystalline semiconductor substrate, a phosphorus (P)-doped n-type semiconductor layer and a collecting electrode formed over the entire surface of the n-type semiconductor layer are formed, in the order they appear in this sentence, on the other surface side of the crystalline semiconductor substrate, and photovoltaic power is generated between the crystalline semiconductor substrate and the p-type semiconductor layer by the incident light from one surface of the crystalline semiconductor substrate. Another example of a conventional photoelectric conversion device is a heterojunction solar cell in which intrinsic semiconductor layers, thin-film semiconductor layers, respectively, doped with boron (B) and phosphorus (P), and transparent electrodes are used, instead of doping the semiconductor substrate with boron (B) or phosphorus (P).

In such photoelectric conversion devices, a metal material having no optical transparency is used for the collecting electrodes. Therefore, the light blocked by the collecting electrode on the light receiving surface does not contribute to the photovoltaic power. In other words, part of the light incident on the photoelectric conversion device is lost. Thus, in order to improve the power generation efficiency of the photoelectric conversion device, it is necessary to reduce the light blocked by the collecting electrode as much as possible.

In contrast, if the width of the collecting electrode is reduced in order to reduce the light blocked by the collecting electrode on the light receiving surface, the electrical resistance of the collecting electrode increases. If the electrical resistance of the collecting electrode increases, the efficiency of collecting the charge generated by light irradiation decreases. Consequently, even if the percentage of light blocked by the collecting electrode is reduced and the power generation current is increased, the fill factor of the photoelectric conversion device decreases due to the increase of the electrical resistance of the collecting electrode. Therefore, an adequate improvement of the photoelectric conversion efficiency cannot be expected.

In order to solve such problems, for example, in Patent Literature 1 and Patent Literature 2, the photoelectric conversion devices are a back-contact type in which all the electrodes are formed on one surface side of the semiconductor substrate, thereby eliminating the light blocked on the light irradiation surface and increasing the power generation current. The p-type electrode and the n-type electrode formed on one surface side of the semiconductor substrate are interdigitated so as to reduce the resistance between the electrodes. Moreover, what is called a front surface field (FSF) layer is formed on the light irradiation surface side on which an electrode is not present by doping with P that is of the same polarity as that of the crystalline semiconductor substrate, thereby returning the charge generated by light irradiation into the semiconductor substrate and thus reducing the recombination loss of the charge in the surface.

CITATION LIST

Patent Literature

Patent Literature 1: Japanese Patent Application Laid-open No. 2010-123859

Patent Literature 2: Japanese Patent Application Laid-open No. 2010-129872

SUMMARY

Technical Problem

However, in the FSF region that is formed on the light irradiation surface side of the crystalline semiconductor substrate as described in the above Patent Literature 1 and Patent Literature 2, the charge that is generated by absorbing irradiation light dissipates in the layer. Therefore, the irradiation light absorbed in the FSF region does not contribute to the power generation. As a result, there is a problem in that the photoelectric conversion efficiency is suppressed because of the light absorption by the FSF region.

In contrast, in order to suppress the light absorption by the FSF region, it is necessary to reduce the thickness of the FSF region or reduce the doping concentration of the FSF region. However, when the thickness of the FSF region is reduced or the doping concentration of the FSF region is reduced, the effect of the FSF decreases. In addition to this, the electrical resistance of the FSF region increases. The FSF region located on the p-type electrode has a role of conducting the charge generated near the FSF region in a direction parallel to the substrate surface. Therefore, there is a problem in that if the electrical resistance of the FSF region increases, conduction of the charge is inhibited and thus current loss occurs; therefore, the photoelectric conversion efficiency decreases.

The present invention has been achieved in view of the above and an object of the present invention is to provide a photoelectric conversion device that has excellent photoelectric conversion efficiency, a manufacturing method thereof, and a photoelectric conversion module.

Solution to Problem

In order to solve the above problems and achieve the object, a photoelectric conversion device related to the present invention includes: a first-conductivity-type first semiconductor layer, a second-conductivity-type second semiconductor layer, a first electrode formed on the first semiconductor layer, and a second electrode formed on the second semiconductor layer, on a back surface opposite to a light receiving surface of a first-conductivity-type semiconductor substrate; and a first-conductivity-type semiconductor region on a surface on a light receiving surface side of the semiconductor substrate, wherein in the semiconductor region, a first region that is opposed to the first semiconductor layer with the semiconductor substrate therebetween and a second region that is opposed to the second semiconductor layer with the semiconductor substrate therebetween have different average impurity concentrations.

Advantageous Effects of Invention

According to the present invention, a first region that is opposed to a first semiconductor layer on a back surface of a semiconductor substrate with the semiconductor substrate therebetween and a second region that is opposed to a second semiconductor layer on the back surface of the semiconductor substrate with the semiconductor substrate therebetween have different average impurity concentrations; therefore, an effect is obtained where a photoelectric conversion device that has excellent photoelectric conversion efficiency can be realized.

BRIEF DESCRIPTION OF DRAWINGS

FIG. 1-2 is an expanded plan view of part of the back surface side of the photoelectric conversion device according to the first embodiment of the present invention and is an expanded plan view of region B in FIG. 1-1.

FIG. 1-3 is a cross-sectional view of the schematic configuration of the photoelectric conversion device according to the first embodiment of the present invention and is a cross-sectional view taken along line C-C' in FIG. 1-2.

FIG. 2 is a cross-sectional view of the relevant parts schematically illustrating the flow of charge in the photoelectric conversion device according to the first embodiment of the present invention.

FIG. 3 is a characteristic diagram illustrating the photoelectric conversion characteristics of the photoelectric conversion device according to the first embodiment of the present invention and a conventional photoelectric conversion device.

FIG. 4-1 is a cross-sectional view explaining the procedure of a manufacturing method of the photoelectric conversion device according to the first embodiment of the present invention.

FIG. 4-2 is a cross-sectional view explaining the procedure of the manufacturing method of the photoelectric conversion device according to the first embodiment of the present invention.

FIG. 4-3 is a cross-sectional view explaining the procedure of the manufacturing method of the photoelectric conversion device according to the first embodiment of the present invention.

FIG. 4-4 is a cross-sectional view explaining the procedure of the manufacturing method of the photoelectric conversion device according to the first embodiment of the present invention.

FIG. 4-5 is a cross-sectional view explaining the procedure of the manufacturing method of the photoelectric conversion device according to the first embodiment of the present invention.

FIG. 4-6 is a cross-sectional view explaining the procedure of the manufacturing method of the photoelectric conversion device according to the first embodiment of the present invention.

FIG. 4-7 is a cross-sectional view explaining the procedure of the manufacturing method of the photoelectric conversion device according to the first embodiment of the present invention.

FIG. 4-8 is a cross-sectional view explaining the procedure of the manufacturing method of the photoelectric conversion device according to the first embodiment of the present invention.

FIG. 4-9 is a cross-sectional view explaining the procedure of the manufacturing method of the photoelectric conversion device according to the first embodiment of the present invention.

FIG. 4-10 is a cross-sectional view explaining the procedure of the manufacturing method of the photoelectric conversion device according to the first embodiment of the present invention.

FIG. 5-1 is a perspective view of the schematic configuration of a photoelectric conversion device according to a second embodiment of the present invention viewed from the back surface side opposite to the light receiving surface.

FIG. 5-2 is an expanded plan view of part of the back surface side of the photoelectric conversion device according to the second embodiment of the present invention and is an expanded plan view of region G in FIG. 5-1.

FIG. 5-3 is a cross-sectional view of the schematic configuration of the photoelectric conversion device according to the second embodiment of the present invention and is a cross-sectional view taken along line H-H' in FIG. 5-2.

FIG. 6 is a cross-sectional view of the relevant parts schematically illustrating the flow of charge in the photoelectric conversion device according to the second embodiment of the present invention.

FIG. 7-1 is a cross-sectional view explaining the procedure of a manufacturing method of the photoelectric conversion device according to the second embodiment of the present invention.

FIG. 7-2 is a cross-sectional view explaining the procedure of the manufacturing method of the photoelectric conversion device according to the second embodiment of the present invention.

FIG. 7-3 is a cross-sectional view explaining the procedure of the manufacturing method of the photoelectric conversion device according to the second embodiment of the present invention.

FIG. 7-4 is a cross-sectional view explaining the procedure of the manufacturing method of the photoelectric conversion device according to the second embodiment of the present invention.

FIG. 7-5 is a cross-sectional view explaining the procedure of the manufacturing method of the photoelectric conversion device according to the second embodiment of the present invention.

FIG. 7-6 is a cross-sectional view explaining the procedure of the manufacturing method of the photoelectric conversion device according to the second embodiment of the present invention.

FIG. 7-7 is a cross-sectional view explaining the procedure of the manufacturing method of the photoelectric conversion device according to the second embodiment of the present invention.

FIG. 7-8 is a cross-sectional view explaining the procedure of the manufacturing method of the photoelectric conversion device according to the second embodiment of FIG. 7-9 is a cross-sectional view explaining the procedure of the manufacturing method of the photoelectric conversion device according to the second embodiment of the present invention.

FIG. 7-10 is a cross-sectional view explaining the procedure of the manufacturing method of the photoelectric conversion device according to the second embodiment of the present invention.

FIG. 8-1 is a perspective view of the schematic configuration of a photoelectric conversion device according to a third embodiment of the present invention viewed from the back surface side opposite to the light receiving surface.

FIG. 8-2 is an expanded plan view of part of the back surface side of the photoelectric conversion device according to the third embodiment of the present invention and is an expanded plan view of region P in FIG. 8-1.

FIG. 8-3 is a cross-sectional view of the schematic configuration of the photoelectric conversion device according to the third embodiment of the present invention and is a cross-sectional view taken along line Q-Q' in FIG. 8-2.

FIG. 9 is a cross-sectional view of the relevant parts schematically illustrating the flow of charge in the photoelectric conversion device according to the third embodiment of the present invention.

FIG. 10-1 is a cross-sectional view explaining the procedure of a manufacturing method of the photoelectric conversion device according to the third embodiment of the present invention.

FIG. 10-2 is a cross-sectional view explaining the procedure of the manufacturing method of the photoelectric conversion device according to the third embodiment of the present invention.

FIG. 10-3 is a cross-sectional view explaining the procedure of the manufacturing method of the photoelectric conversion device according to the third embodiment of the present invention.

FIG. 10-4 is a cross-sectional view explaining the procedure of the manufacturing method of the photoelectric conversion device according to the third embodiment of the present invention.

FIG. 10-5 is a cross-sectional view explaining the procedure of the manufacturing method of the photoelectric conversion device according to the third embodiment of the present invention.

FIG. 10-6 is a cross-sectional view explaining the procedure of the manufacturing method of the photoelectric conversion device according to the third embodiment of the present invention.

FIG. 10-7 is a cross-sectional view explaining the procedure of the manufacturing method of the photoelectric conversion device according to the third embodiment of the present invention.

FIG. 10-8 is a cross-sectional view explaining the procedure of the manufacturing method of the photoelectric conversion device according to the third embodiment of the present invention.

FIG. 10-9 is a cross-sectional view explaining the procedure of the manufacturing method of the photoelectric conversion device according to the third embodiment of the present invention.

FIG. 10-10 is a cross-sectional view explaining the procedure of the manufacturing method of the photoelectric conversion device according to the third embodiment of the present invention.

FIG. 10-11 is a cross-sectional view explaining the procedure of the manufacturing method of the photoelectric conversion device according to the third embodiment of the present invention.

DESCRIPTION OF EMBODIMENTS

Figure 1:
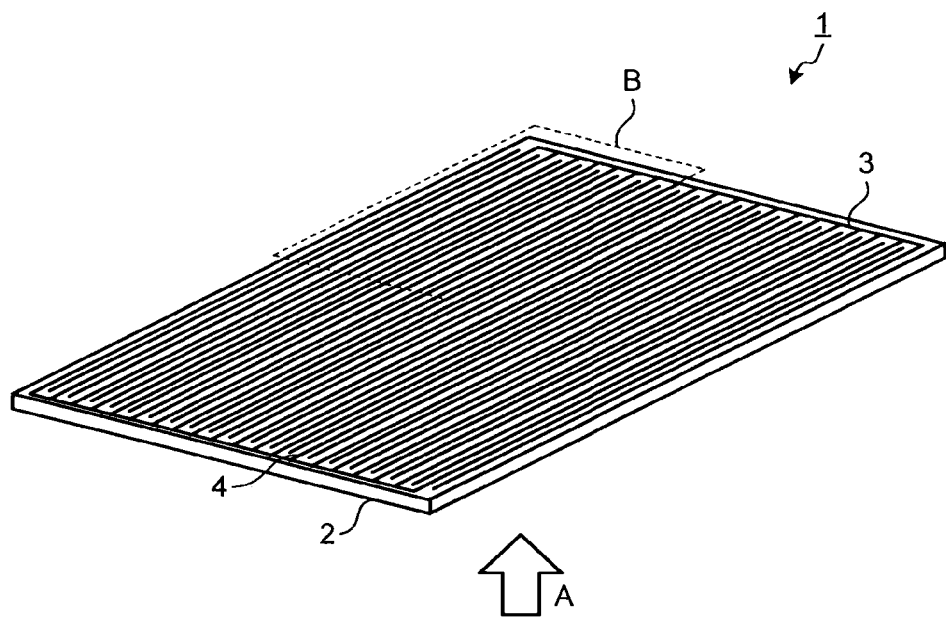
FIG. 1-1 is a perspective view of the schematic configuration of a photoelectric conversion device according to a first embodiment of the present invention viewed from the back surface side opposite to the light receiving surface.

Exemplary embodiments of a photoelectric conversion device, a manufacturing method thereof, and a photoelectric conversion module according to the present invention will be explained below in detail with reference to the drawings. The present invention is not limited to the following descriptions and can be modified as appropriate without departing from the scope of the present invention. In the drawings explained below, for ease of understanding, scales of respective components may be shown differently from the actuality. This holds true for the relations between the drawings too. Hatching is applied even to plan views in some cases in order to facilitate visualization of the drawings.

First Embodiment

Figures 1, 2:
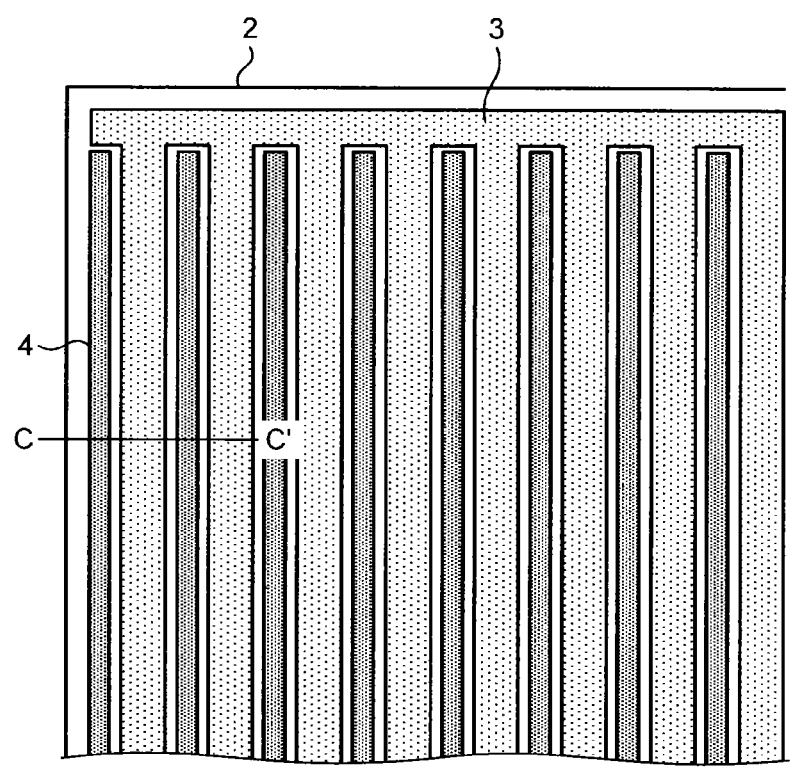
Figures 1, 2, 3:
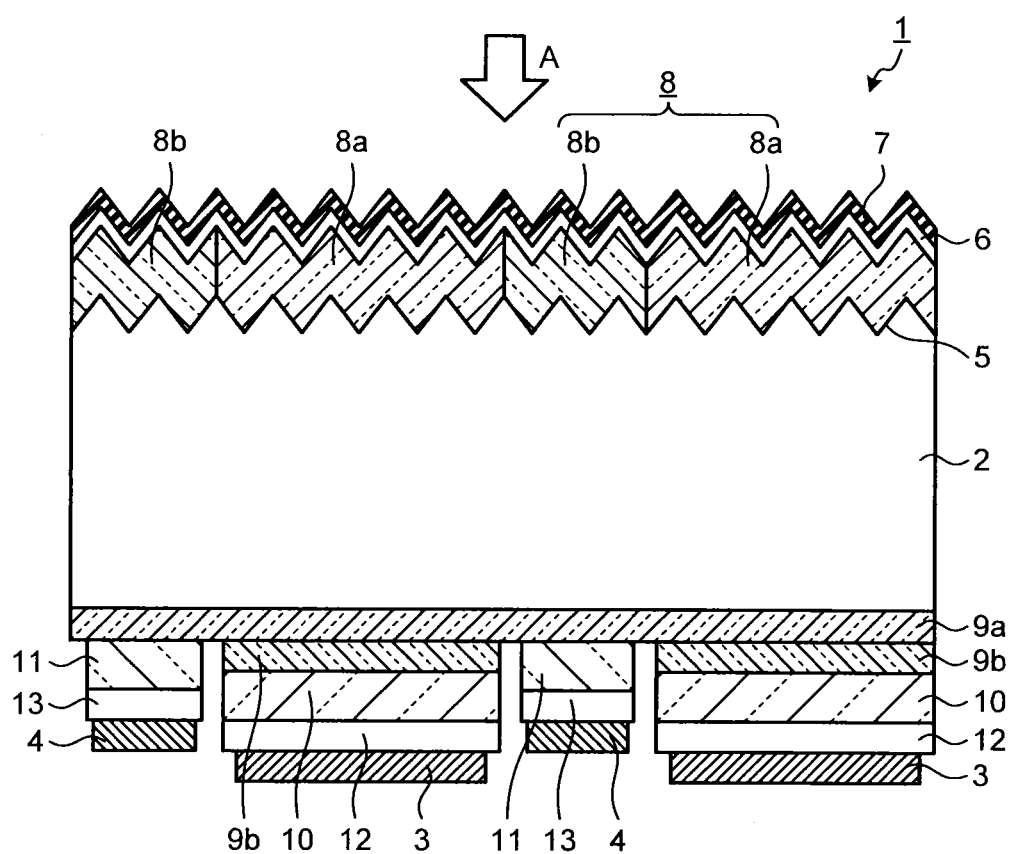
Figure 2:
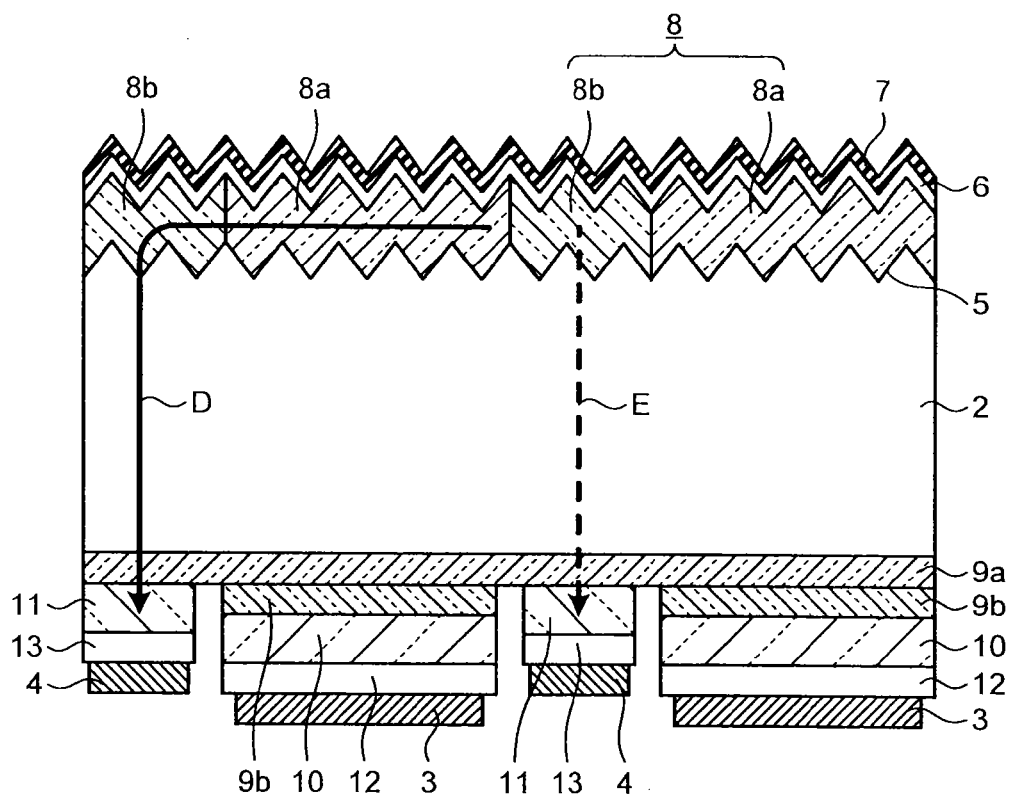
Figure 3:
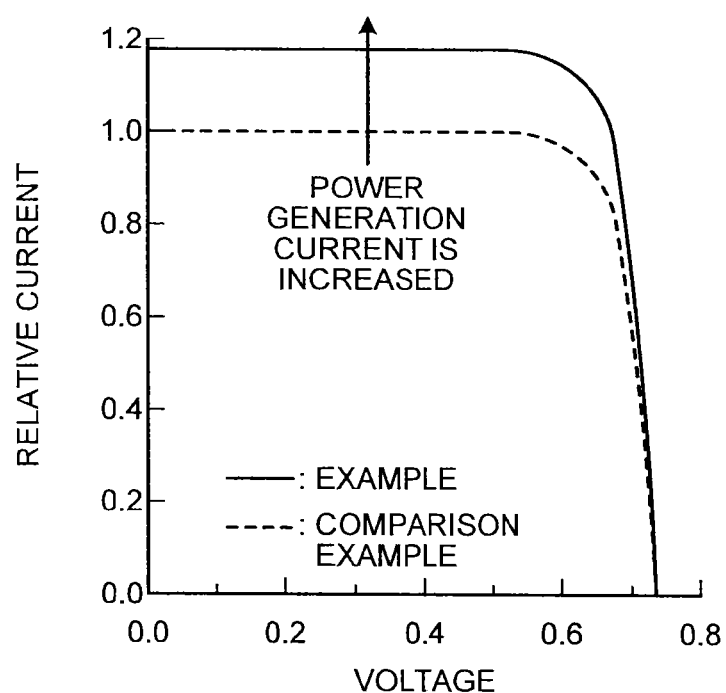

FIG. 1-1 is a perspective view of the schematic configuration of a photoelectric conversion device 1 according to a first embodiment of the present invention viewed from the back surface side opposite to the light receiving surface. FIG. 1-2 is an expanded plan view of part of the back surface side of the photoelectric conversion device 1 and is an expanded plan view of region B in FIG. 1-1. FIG. 1-3 is a cross-sectional view of the schematic configuration of the photoelectric conversion device 1 and is a cross-sectional view taken along line C-C' in FIG. 1-2. As illustrated in FIG. 1-1 to FIG. 1-3, in the photoelectric conversion device 1, on the back surface side that is opposite to the light receiving surface of an n-type crystalline silicon substrate 2, a p-type semiconductor layer 10 doped with boron (B), a transparent electrode 12, and a collecting electrode 3 thinned into a comb shape are formed in the order they appear in this sentence and an n-type semiconductor layer 11 doped with phosphorus (P), a transparent electrode 13, and a collecting electrode 4 thinned into a comb shape are formed in the order they appear in this sentence.

The collecting electrode 3 and the collecting electrode 4 are interdigitated in such a way that their respective comb-shaped thinned portions are alternately arranged at regular intervals in the plane direction of the back surface of the photoelectric conversion device 1, and the comb-shaped thinned portions of the collecting electrode 3 and the collecting electrode 4 are connected at their respective one end portions. In FIG. 1-2, only one end portion of the collecting electrode 3 out of the one end portions of the collecting electrode 3 and of the collecting electrode 4 is illustrated; however, the comb-shaped thinned portions of the collecting electrode 4 are also connected at one end portion on the opposite side (not illustrated) in a similar manner. In the photoelectric conversion device 1, solar light A enters the light receiving surface that is the surface of the n-type crystalline silicon substrate 2 and is a different surface from the surface on which the collecting electrode 3 and the collecting electrode 4 are formed.

Next, a detailed configuration of the photoelectric conversion device 1 will be explained with reference to FIG. 1-3. The cross-sectional view illustrated in FIG. 1-3 is inverted for the purposes of the explanation. In other words, the solar light A enters the photoelectric conversion device 1 from above in FIG. 1-3. The n-type crystalline silicon substrate 2 has a specific resistance of 1 to 10 Ω·cm and has a thickness of 50 μm or more and 300 μm or less. A texture structure 5 composed of microasperities, called a texture, is formed on the surface on the light receiving surface side of the n-type crystalline silicon substrate 2.

An n-type semiconductor region 8, which includes an n-type semiconductor region 8a and an n-type semiconductor region 8b, is formed as an FSF region on the surface layer on the light receiving surface side of the n-type crystalline silicon substrate 2. Due to the FSF effect, the n-type semiconductor region 8a and the n-type semiconductor region 8b have a role of returning the charge generated in the n-type crystalline silicon substrate 2 into the n-type crystalline silicon substrate 2. A passivation film 6 and an anti-reflective film 7, each composed of a single layer film or a laminated film of two or more layers, are formed on the n-type semiconductor region 8 in the order they appear in this sentence.

A passivation film 9a is formed on the other surface (back surface) side of the n-type crystalline silicon substrate 2, on which the texture structure 5 is not formed. In part of the region on the passivation film 9a, a passivation film 9b, the p-type semiconductor layer 10 doped with boron (B), the transparent electrode 12, and the collecting electrode 3 thinned into a comb shape are formed in the order they appear in this sentence. In the other part of the region on the passivation film 9a, the n-type semiconductor layer 11 doped with phosphorus (P), the transparent electrode 13, and the collecting electrode 4 thinned into a comb shape are formed in the order they appear in this sentence.

As described above, the collecting electrode 3 and the collecting electrode 4 are interdigitated in such a way that their respective comb-shaped thinned portions are alternately arranged at regular intervals above the passivation film 9a, and the comb-shaped thinned portions of the collecting electrode 3 and the collecting electrode 4 are connected at their respective one end portions. The passivation film 9b, the p-type semiconductor layer 10, and the transparent electrode 12 have substantially the same shape as the comb-shaped collecting electrode 3 in the plane direction of the n-type crystalline silicon substrate 2. The n-type semiconductor layer 11 and the transparent electrode 13 have substantially the same shape as the comb-shaped collecting electrode 4 in the plane direction of the n-type crystalline silicon substrate 2. The transparent electrode 12 is arranged between the p-type semiconductor layer 10 and the collecting electrode 3 so as to improve the electrical connection between the p-type semiconductor layer 10 and the collecting electrode 3. The transparent electrode 13 is arranged between the n-type semiconductor layer 11 and the collecting electrode 4 so as to improve the electrical connection between the n-type semiconductor layer 11 and the collecting electrode 4.

In the plane direction of the n-type crystalline silicon substrate 2, the n-type semiconductor region 8a is formed to correspond to the position opposed to the p-type semiconductor layer 10 formed on the back surface side of the n-type crystalline silicon substrate 2. In the plane direction of the n-type crystalline silicon substrate 2, the n-type semiconductor region 8b is formed to correspond to the position opposed to the n-type semiconductor layer 11 formed on the back surface side of the n-type crystalline silicon substrate 2. The n-type semiconductor region 8a and the n-type semiconductor region 8b have approximately the same thickness but have different impurity concentrations. The n-type semiconductor region 8b has an impurity concentration lower than that of the n-type semiconductor region 8a. In the photoelectric conversion device 1 according to the first embodiment, the maximum impurity concentration of the n-type semiconductor region 8a provided at the position opposed to the p-type semiconductor layer 10 is $1 \times 10^{18}$ cm$^{-3}$, the maximum impurity concentration of the n-type semiconductor region 8b provided at the position opposed to the n-type semiconductor layer 11 is $1 \times 10^{16}$ cm$^{-3}$, and the n-type semiconductor region 8b and the n-type semiconductor region 8a have the same thickness. The average impurity concentration of the n-type semiconductor region 8a is approximately $0.5 \times 10^{18}$ cm$^{-3}$ and the average impurity concentration of the n-type semiconductor region 8b is approximately $0.5 \times 10^{16}$ cm$^{-3}$.

FIG. 2 is a cross-sectional view of the relevant parts schematically illustrating the flow of charge in the photoelectric conversion device 1 according to the first embodiment. In the back-contact photoelectric conversion device 1 in which all the collecting electrodes are formed on one surface side (back surface side) of the n-type crystalline silicon substrate 2, the charge generated in the n-type semiconductor region 8a located over the p-type semiconductor layer 10, i.e., located at the position opposed to the p-type semiconductor layer 10, moves in a direction parallel to the substrate surface of the n-type crystalline silicon substrate 2 and reaches the n-type semiconductor layer 11. In other words, because the electrical resistance of the n-type semiconductor region 8a is lower than that of the n-type crystalline silicon substrate 2, part of the charge generated in the substrate surface on the light receiving surface side of the n-type crystalline silicon substrate 2, on which a collecting electrode is not present, moves in the n-type semiconductor region 8a and, thereafter, moves in the thickness direction of the n-type crystalline silicon substrate 2 and reaches the n-type semiconductor layer 11. In FIG. 2, the flow of the charge that moves in the n-type semiconductor region 8a is indicated by a solid-line arrow D. In such a case, because the electrical resistance of the n-type semiconductor region 8a is lower than that of the n-type crystalline silicon substrate 2, the voltage loss due to the charge transfer is reduced compared with the case where the charge moves in a direction parallel to the substrate surface in the n-type crystalline silicon substrate 2. Therefore, the power generation efficiency is improved because of the charge transfer in the n-type semiconductor region 8a and thus the photoelectric conversion efficiency is improved.

In contrast, the n-type semiconductor region 8b provided at the position opposed to the n-type semiconductor layer 11 has an average impurity concentration lower than that of the n-type semiconductor region 8a. Typically, when the impurity concentration of a semiconductor is low, the charge loss due to recombination is reduced. The charge generated in the n-type semiconductor region 8b and near the n-type semiconductor region 8b mainly moves in the thickness direction of the n-type crystalline silicon substrate 2 and reaches the p-type semiconductor layer 10 and the n-type semiconductor layer 11; therefore, the resistance of the n-type semiconductor region 8b hardly contributes to the charge transfer. Therefore, by reducing the average impurity concentration of the n-type semiconductor region 8b, the charge loss due to recombination in the n-type semiconductor region 8b can be reduced without hindering the charge transfer and, as a result, the power generation current can be increased. Accordingly, the power generation efficiency is improved and thus the photoelectric conversion efficiency is improved. In FIG. 2, the motion of the charge generated in the n-type semiconductor region 8b and near the n-type semiconductor region 8b is indicated by a broken-line arrow E.

FIG. 3 is a characteristic diagram illustrating the photoelectric conversion characteristics of the photoelectric conversion device 1 according to the first embodiment and a conventional photoelectric conversion device. As described above, in the photoelectric conversion device 1, the maximum impurity concentration of the n-type semiconductor region 8a is approximately $1 \times 10^{18}$ cm$^{-3}$; the maximum impurity concentration of the n-type semiconductor region 8b is approximately $1 \times 10^{16}$ cm$^{-3}$; the average impurity concentration of the n-type semiconductor region 8a is approximately $0.5 \times 10^{18}$ cm$^{-3}$; and the average impurity concentration of the n-type semiconductor region 8b is approximately $0.5 \times 10^{16}$ cm$^{-3}$. FIG. 3 illustrates the photoelectric conversion characteristics, derived assuming that the above conditions are applied, of the photoelectric conversion device 1 (example) according to the first embodiment and the conventional photoelectric conversion device (comparison example). The conventional photoelectric conversion device has the same configuration as that of the photoelectric conversion device 1 according to the first embodiment except for the inclusion of an n-type semiconductor region (FSF region) having a uniform impurity concentration instead of the n-type semiconductor region 8 (FSF region) including the n-type semiconductor region 8a and the n-type semiconductor region 8b. The average impurity concentration of the n-type semiconductor region (FSF region) in the photoelectric conversion device of the comparison example is $0.5 \times 10^{18}$ cm$^{-3}$.

It is found from FIG. 3 that the power generation current is improved in the photoelectric conversion device 1 according to the first embodiment compared with that in the conventional photoelectric conversion device. This is because the charge loss in the n-type semiconductor region 8b is reduced in the photoelectric conversion device 1 according to the first embodiment. Therefore, in the photoelectric conversion device 1 according to the first embodiment, it becomes obvious that the photoelectric conversion efficiency is improved by reducing only the impurity concentration of the n-type semiconductor region 8b in the FSF region when compared with the conventional photoelectric conversion device that includes an n-type semiconductor region (FSF region) that has a uniform impurity concentration.

Figures 1, 4:
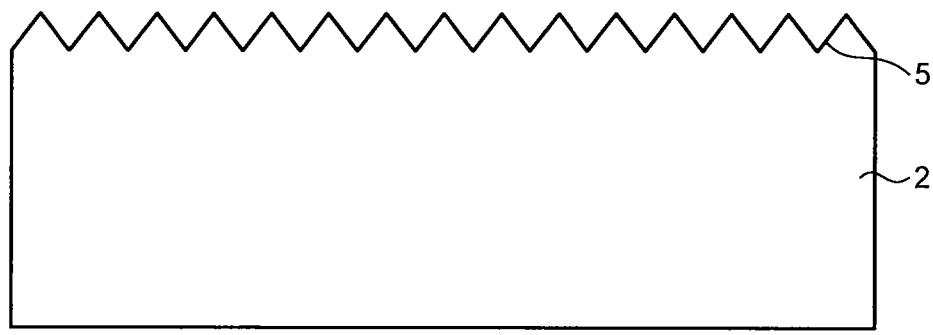
Figures 2, 4:
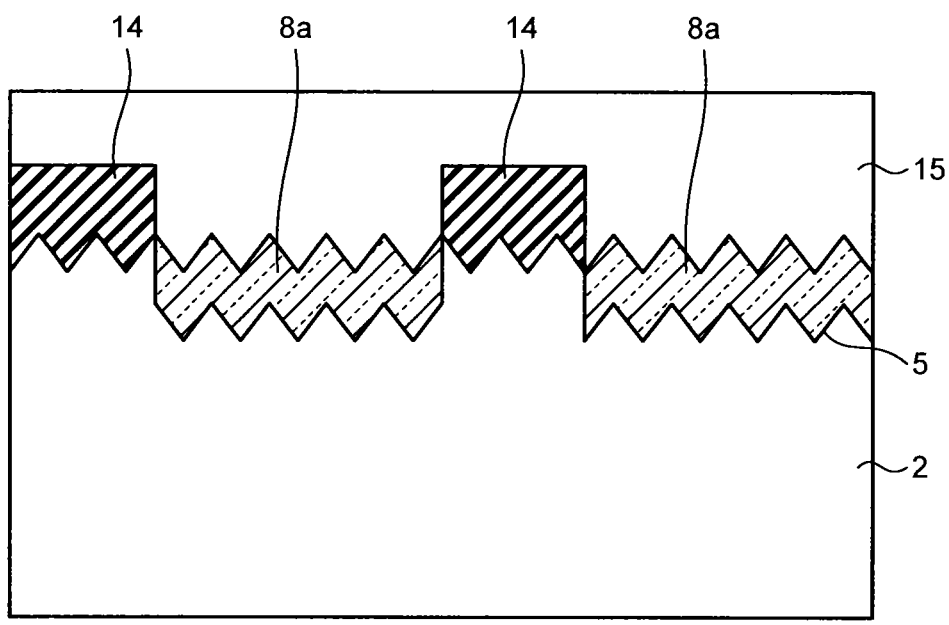
Figures 3, 4:
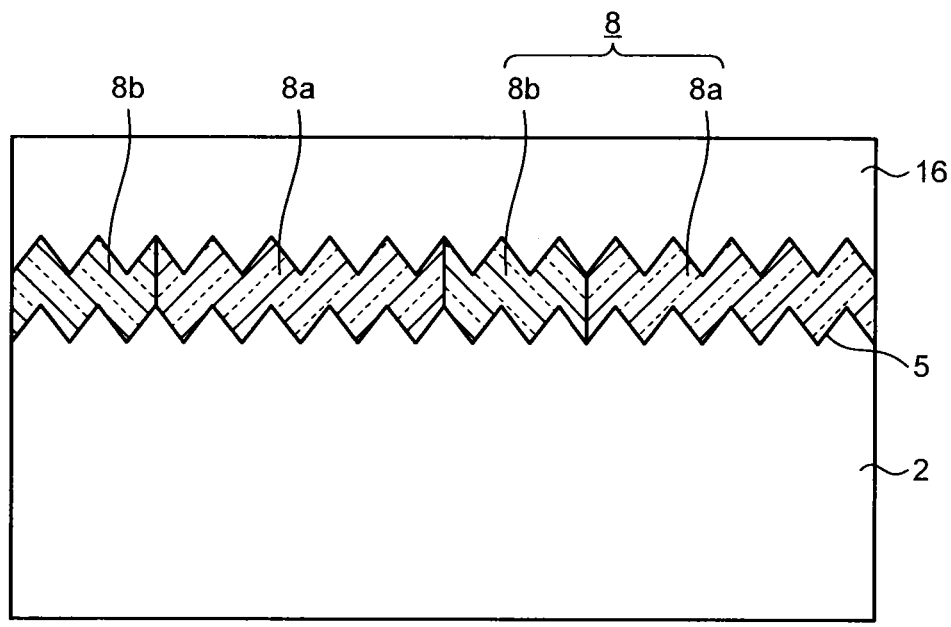
Figure 4:
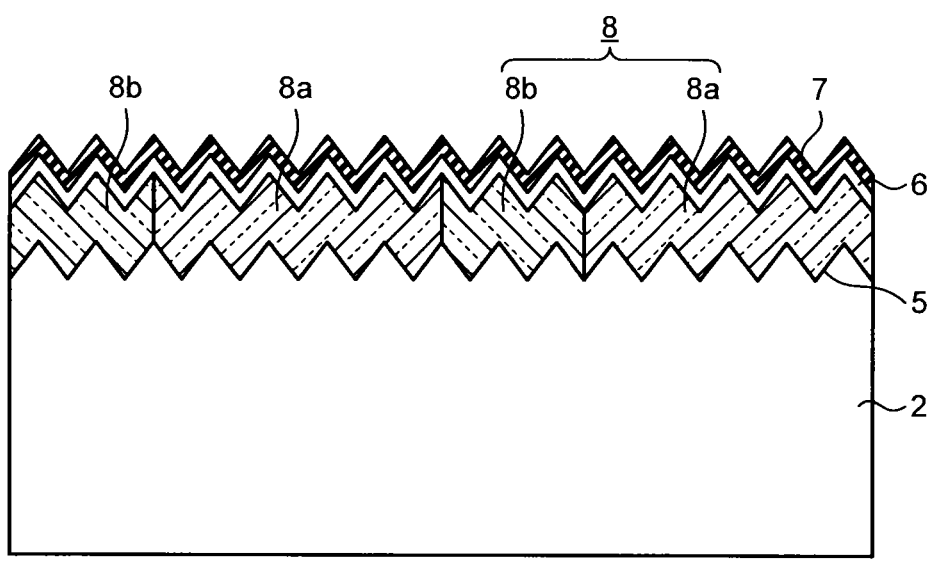

Next, the manufacturing method of the photoelectric conversion device 1 according to the first embodiment will be explained. FIG. 4-1 to FIG. 4-10 are cross-sectional views explaining the procedure of the manufacturing method of the photoelectric conversion device 1 according to the first embodiment. First, as illustrated in FIG. 4-1, the texture structure 5 composed of microasperities, called a texture, is formed on the light receiving surface side of the n-type crystalline silicon substrate 2. The microasperities are formed by using acid or alkaline etching solution. At this point, the other surface side of the n-type crystalline silicon substrate 2 is covered with resin, such as a resist, a dielectric film, or the like so that the texture structure is not formed on the other surface side of the n-type crystalline silicon substrate 2. Before the microasperities are formed, the process of removing the damaged layer on the surface of the n-type crystalline silicon substrate 2 may be performed. In addition to the above, after the process of removing the damaged layer, it is desirable to perform a gettering process of the impurity in the n-type crystalline silicon substrate 2 in order to improve the performance of the photoelectric conversion device. For example, a phosphorus diffusion process is used as the gettering process.

After the texture structure 5 is formed, as illustrated in FIG. 4-2, on the light receiving surface side of the n-type crystalline silicon substrate 2, on which the texture structure 5 is formed, a protective film 14 is formed in the region opposed to the region in which the n-type semiconductor layer 11 is to be formed on the back surface side of the n-type crystalline silicon substrate 2. For example, a silicon oxide film or a silicon nitride film is used as the protective film 14. The protective film 14 is formed, for example, in the following manner. That is, a protective film is formed over the entire surface on the light receiving surface side of the n-type crystalline silicon substrate 2, the region opposed to the region in which the n-type semiconductor layer 11 is to be formed is covered with a resist, and thereafter, unnecessary portions are removed by using the resist as a mask. Thereafter, the resist is removed.

Next, in order to diffuse phosphorus (P), a phosphorus diffusion source 15, such as POCl$_3$, is formed over the entire surface on the light receiving surface side of the n-type crystalline silicon substrate 2 such that it covers the protective film 14, and a heat treatment (phosphorus diffusion process) is performed at a temperature of, for example, 750° C. or higher. Accordingly, phosphorus (P) is diffused into the surface on the light receiving surface side of the n-type crystalline silicon substrate 2 and thus the n-type semiconductor region 8a is formed in the region opposed to the region in which the p-type semiconductor layer 10 is to be formed. At this point, the concentration of phosphorus (P) diffused into the surface on the light receiving surface side of the n-type crystalline silicon substrate 2 can be controlled by adjusting the temperature and the treatment time of the heat treatment. On the surface on the light receiving surface side of the n-type crystalline silicon substrate 2, phosphorus (P) is not diffused into the region opposed to the region in which the n-type semiconductor layer 11 is to be formed because this region is covered with the protective film 14. Thereafter, the protective film 14 and the phosphorus diffusion source 15 are removed.

Next, as illustrated in FIG. 4-3, a phosphorus diffusion source 16 is formed on the surface on the light receiving surface side of the n-type crystalline silicon substrate 2 and a heat treatment is performed. Accordingly, phosphorus (P) is diffused into the surface on the light receiving surface side of the n-type crystalline silicon substrate 2 and thus the n-type semiconductor region 8b is formed in the region opposed to the region in which the n-type semiconductor layer 11 is to be formed on the back surface side of the n-type crystalline silicon substrate 2. At this point, a lower heat treatment temperature or a shorter treatment time than that in the heat treatment (phosphorus diffusion process) for forming the n-type semiconductor region 8a described above is applied, thereby making the phosphorus (P) concentration of the n-type semiconductor region 8b lower than that of the n-type semiconductor region 8a. Accordingly, the n-type semiconductor region 8b having a lower impurity concentration than that of the n-type semiconductor region 8a is formed. Thereafter, the phosphorus diffusion source 16 is removed.

Next, as illustrated in FIG. 4-4, the passivation film 6 and the anti-reflective film 7 are formed, in the order they appear in this sentence, on the surface on the light receiving surface side of the n-type crystalline silicon substrate 2 having the texture structure 5 by using a chemical vapor deposition (CVD) method. For example, a silicon oxide film, a silicon nitride film, or the like is used as the passivation film 6. An n-type amorphous silicon film, an n-type microcrystalline silicon thin film, or the like having the same conductivity type as that of the n-type crystalline silicon substrate 2 may be used as the passivation film 6. Furthermore, a laminated film of an intrinsic amorphous silicon film and an n-type amorphous silicon film or an n-type microcrystalline silicon film may be used as the passivation film 6. The film thickness of the passivation film 6 at this point is preferably 5 nm or more and 20 nm or less in order to suppress light absorption in the passivation film 6. It is advisable to use a plasma CVD method, a thermal CVD method, or the like as the CVD method. For example, a silicon oxide film, a silicon nitride film, or a laminated film thereof is used as the anti-reflective film 7. When the passivation film 6 is a silicon oxide film or a silicon nitride film, this film may also serve as an anti-reflective film.

Figures 4, 5:
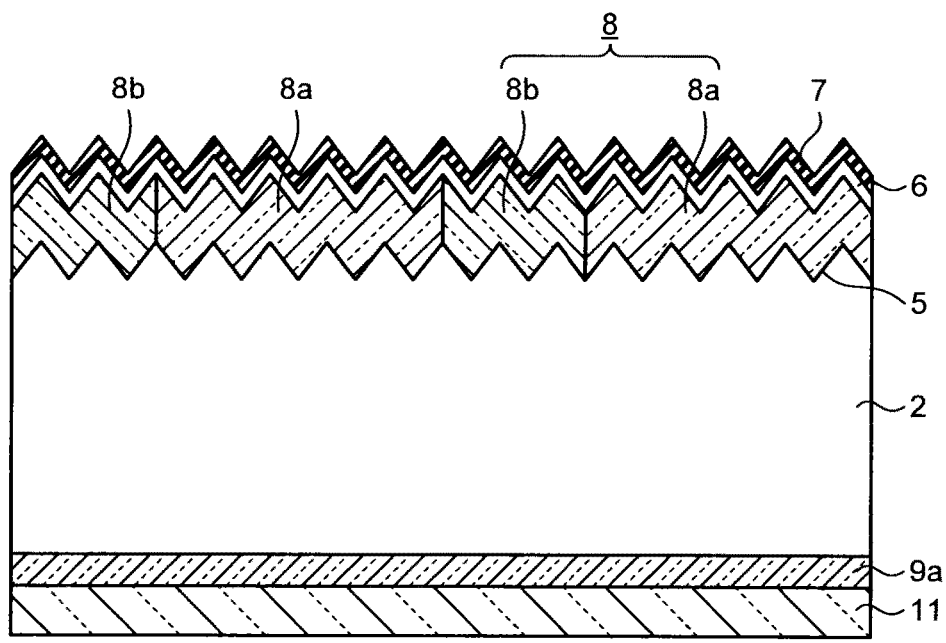

Next, as illustrated in FIG. 4-5, the passivation film 9a and the n-type semiconductor layer 11 are formed, in the order they appear in this sentence, on the back surface side of the n-type crystalline silicon substrate 2, on which the texture structure 5 is not formed. For example, an intrinsic amorphous silicon film, an intrinsic microcrystalline silicon film, or the like is used as the passivation film 9a. For example, an amorphous silicon film or a microcrystalline silicon film, doped with phosphorus (P), is used as the n-type semiconductor layer 11. The film thickness of the n-type semiconductor layer 11 is preferably 20 nm or less in order to suppress optical loss in the n-type semiconductor layer 11. At this point, before the passivation film 9a is formed, it is preferable to clean the back surface of the n-type crystalline silicon substrate 2 with hydrofluoric acid (HF), hydrochloric acid (HCL) to which hydrogen peroxide solution ($H_2O_2$) is added, ammonia ($NH_3$) solution, or the like. The film thickness of the passivation film 9a is, for example, preferably 2 nm to 5 nm.

Figures 4, 5, 6:
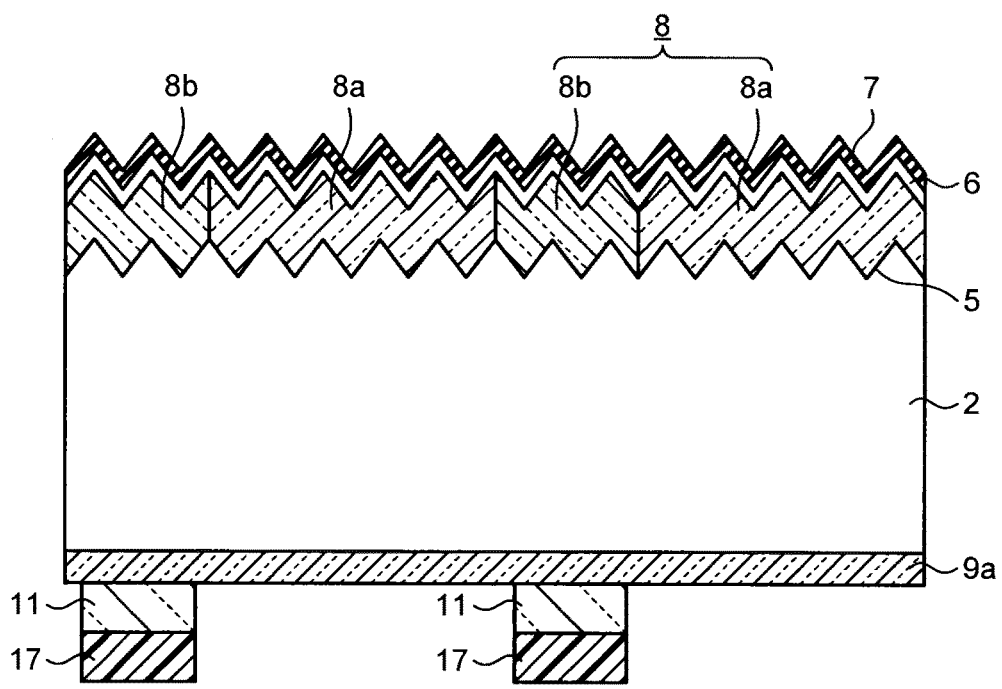

After the passivation film 9a and the n-type semiconductor layer 11 are formed, as illustrated in FIG. 4-6, necessary portions of the n-type semiconductor layer 11 are covered with a resist 17 and unnecessary portions of the n-type semiconductor layer 11 are removed. The plane arrangement pattern of the resist 17 at this point is of such a shape that the width thereof is larger by approximately 50 µm to 100 µm than that of the pattern of the collecting electrode 4 as illustrated in FIG. 1-2. As a method of removing the unnecessary portions of the n-type semiconductor layer 11, for example, wet etching, plasma etching, etching paste, or the like is used. At this point, the passivation film 9a is prevented from being removed. Thereafter, the resist 17 is removed. Instead of covering the necessary portions of the n-type semiconductor layer 11 with the resist 17 and performing etching, the unnecessary portions of the n-type semiconductor layer 11 may be removed by printing etching paste on the unnecessary portions of the n-type semiconductor layer 11.

Next, as illustrated in FIG. 4-7, the passivation film 9b and the p-type semiconductor layer 10 doped with boron (B) are formed, in the order they appear in this sentence, on the back surface side of the n-type crystalline silicon substrate 2. For example, an intrinsic amorphous silicon film, an intrinsic microcrystalline silicon film, or the like is used as the passivation film 9b. An amorphous silicon film doped with boron (B) or a microcrystalline silicon film doped with boron (B) is used as the p-type semiconductor layer 10. The film thickness of the passivation film 9b is, for example, preferably 2 nm to 5 nm. In addition to this, the film thickness of the p-type semiconductor layer 10 is preferably 10 nm or less in order to suppress optical loss in the p-type semiconductor layer 10.

After the passivation film 9b and the n-type semiconductor layer 10 are formed, as illustrated in FIG. 4-8, necessary portions of the p-type semiconductor layer 10 are covered with a resist 18 and unnecessary portions of the passivation film 9b and the p-type semiconductor layer 10 are removed. The plane arrangement pattern of the resist 18 at this point is of such a shape that the width thereof is larger by approximately 50 µm to 100 µM than that of the pattern of the collecting electrode 3 as illustrated in FIG. 1-2. As a method of removing the unnecessary portions of the passivation film 9b and the p-type semiconductor layer 10, for example, wet etching, plasma etching, etching paste, or the like is used. At this point, the n-type semiconductor layer 11 and the passivation film 9a are prevented from being removed. Thereafter, the resist 18 is removed. Instead of covering the necessary portions of the p-type semiconductor layer 10 with the resist and performing etching, the unnecessary portions of the passivation film 9b and the p-type semiconductor layer 10 may be removed by printing etching paste on the unnecessary portions of the p-type semiconductor layer 10.

Next, a transparent conductive film is formed on the back surface side of the n-type crystalline silicon substrate 2 by a sputtering method or the like. Thereafter, the transparent conductive film other than that in the regions on the p-type semiconductor layer 10 and the n-type semiconductor layer 11 is removed by using etching paste. Accordingly, as illustrated in FIG. 4-9, the transparent electrode 12 is formed on the p-type semiconductor layer 10 and the transparent electrode 13 is formed on the n-type semiconductor layer 11. As the transparent conductive film, for example, indium oxide ($In_2O_3$: Indium Oxide), indium oxide doped with tin (ITO: Indium Tin Oxide), zinc oxide (ZnO: Zinc Oxide), or the like is used. Before the transparent conductive film is formed, a heat treatment may be performed on the n-type crystalline silicon substrate 2 at a temperature of approximately 200° C. in order to improve the defect passivation effect of the passivation film.

Next, as illustrated in FIG. 4-10, the collecting electrode 3 is formed on the transparent electrode 12 and the collecting electrode 4 is formed on the transparent electrode 13. The collecting electrode 3 and the collecting electrode 4 are formed by printing, for example, silver (Ag) paste. The collecting electrode 3 and the collecting electrode 4 may be formed by metal plating using copper (Cu) or the like instead of silver paste (Ag). By performing the processes described above, the photoelectric conversion device 1 according to the first embodiment having the configuration illustrated in FIG. 1-1 to FIG. 1-3 is obtained. The forming of the light receiving surface side and the back surface side of the photoelectric conversion device 1 may be performed in the opposite order.

As described above, in the photoelectric conversion device 1 according to the first embodiment, the average impurity concentration of the n-type semiconductor region 8b is made lower than that of the n-type semiconductor region 8a. The n-type semiconductor region 8b is an FSF region that does not contribute to the transfer of the charge generated in the substrate surface on the light receiving surface side of the n-type crystalline silicon substrate 2 and is provided at the position opposed to the n-type semiconductor layer 11 with the n-type crystalline silicon substrate 2 therebetween. Typically, when the impurity concentration of a semiconductor is reduced, the charge loss due to recombination is reduced. In the photoelectric conversion device 1, the average impurity concentration of the n-type semiconductor region 8b is reduced; therefore, the charge loss due to recombination in the n-type semiconductor region 8b is reduced. In contrast, while the n-type semiconductor region 8a, which is an FSF region provided at the position opposed to the p-type semiconductor layer 10, has a role of conducting the generated charge to the n-type semiconductor layer 11, the charge generated in the n-type semiconductor region 8b and near the n-type semiconductor region 8b is conducted only in the direction substantially vertical to the substrate surface; therefore, the n-type semiconductor region 8b does not contribute to the charge conduction. Accordingly, in the photoelectric conversion device 1, the power generation current is increased while maintaining the conduction of the charge by the FSF region; therefore, a photoelectric conversion device having a high photoelectric conversion efficiency is realized.

Thus, according to the first embodiment, an effect is obtained where it is possible to realize a back-contact photoelectric conversion device that offers high power generation current and has excellent photoelectric conversion efficiency.

Second Embodiment

FIG. 5-1 is a perspective view of the schematic configuration of a photoelectric conversion device 101 according to a second embodiment of the present invention viewed from the back surface side opposite to the light receiving surface. FIG. 5-2 is an expanded plan view of part of the back surface side of the photoelectric conversion device 101 and is an expanded plan view of region G in FIG. 5-1. FIG. 5-3 is a cross-sectional view of the schematic configuration of the photoelectric conversion device 101 and is a cross-sectional view taken along line H-H' in FIG. 5-2. As illustrated in FIG. 5-1 to FIG. 5-3, in the photoelectric conversion device 101, on the back surface side that is opposite to the light receiving surface of an n-type crystalline silicon substrate 102, a p-type semiconductor layer 110 doped with boron (B), a transparent electrode 112, and a collecting electrode 103 thinned into a comb shape are formed in the order they appear in this sentence and an n-type semiconductor layer 111 doped with phosphorus (P), a transparent electrode 113, and a collecting electrode 104 thinned into a comb shape are formed in the order they appear in this sentence.

The collecting electrode 103 and the collecting electrode 104 are interdigitated in such a way that their respective comb-shaped thinned portions are alternately arranged at regular intervals in the plane direction of the back surface of the photoelectric conversion device 101, and the comb-shaped thinned portions of the collecting electrode 103 and the collecting electrode 104 are connected at their respective one end portions. In FIG. 5-2, only one end portion of the collecting electrode 103 out of the one end portions of the collecting electrode 103 and of the collecting electrode 104 is illustrated; however, the comb-shaped thinned portions of the collecting electrode 104 are also connected at one end portion on the opposite side (not illustrated) in a similar manner. In the photoelectric conversion device 101, solar light F enters the light receiving surface that is the surface of the n-type crystalline silicon substrate 102 and is a different surface from the surface on which the collecting electrode 103 and the collecting electrode 104 are formed.

Next, a detailed configuration of the photoelectric conversion device 101 will be explained with reference to FIG. 5-3. The cross-sectional view illustrated in FIG. 5-3 is inverted for the purposes of the explanation. In other words, the solar light F enters the photoelectric conversion device 101 from above in FIG. 5-3. The n-type crystalline silicon substrate 102 has a specific resistance of 1 to 10 Ω·cm and has a thickness of 50 μm or more and 300 μm or less. A texture structure 105 composed of microasperities, called a texture, is formed on the surface on the light receiving surface side of the n-type crystalline silicon substrate 102.

An n-type semiconductor region 108, which includes an n-type semiconductor region 108a and an n-type semiconductor region 108b, is formed as an FSF region on the surface layer on the light receiving surface side of the n-type crystalline silicon substrate 102. Due to the FSF effect, the n-type semiconductor region 108a and the n-type semiconductor region 108b have a role of returning the charge generated in the n-type crystalline silicon substrate 102 into the n-type crystalline silicon substrate 102. A passivation film 106 and an anti-reflective film 107, each composed of a single layer film or a laminated film of two or more layers, are formed on the n-type semiconductor region 108 in the order they appear in this sentence.

A passivation film 109a is formed on the other surface (back surface) side of the n-type crystalline silicon substrate 102, on which the texture structure 105 is not formed. In part of the region on the passivation film 109a, a passivation film 109b, the p-type semiconductor layer 110 doped with boron (B), the transparent electrode 112, and the collecting electrode 103 thinned into a comb shape are formed in the order they appear in this sentence. In the other part of the region on the passivation film 109a, the n-type semiconductor layer 111 doped with phosphorus (P), the transparent electrode 113, and the collecting electrode 104 thinned into a comb shape are formed in the order they appear in this sentence.

As described above, the collecting electrode 103 and the collecting electrode 104 are interdigitated in such a way that their respective comb-shaped thinned portions are alternately arranged at regular intervals above the passivation film 109a, and the comb-shaped thinned portions of the collecting electrode 103 and the collecting electrode 104 are connected at their respective one end portions. The passivation film 109b, the p-type semiconductor layer 110, and the transparent electrode 112 have substantially the same shape as the comb-shaped collecting electrode 103 in the plane direction of the n-type crystalline silicon substrate 102. The n-type semiconductor layer 111 and the transparent electrode 113 have substantially the same shape as the comb-shaped collecting electrode 104 in the plane direction of the n-type crystalline silicon substrate 102. The transparent electrode 112 is arranged between the p-type semiconductor layer 110 and the collecting electrode 103 so as to improve the electrical connection between the p-type semiconductor layer 110 and the collecting electrode 103. The transparent electrode 113 is arranged between the n-type semiconductor layer 111 and the collecting electrode 104 so as to improve the electrical connection between the n-type semiconductor layer 111 and the collecting electrode 104.

In the plane direction of the n-type crystalline silicon substrate 102, the n-type semiconductor region 108a is formed to correspond to the position opposed to the p-type semiconductor layer 110 formed on the back surface side of the n-type crystalline silicon substrate 102. In the plane direction of the n-type crystalline silicon substrate 102, the n-type semiconductor region 108b is formed to correspond to the position opposed to the n-type semiconductor layer 111 formed on the back surface side of the n-type crystalline silicon substrate 102. The n-type semiconductor region 108a and the n-type semiconductor region 108b have different impurity diffusion depths (impurity penetration depths). The impurity diffusion depth of the n-type semiconductor region 108b is shallower than that of the n-type semiconductor region 108a. In the photoelectric conversion device 101 according to the second embodiment, the impurity diffusion depth of the n-type semiconductor region 108a provided at the position opposed to the p-type semiconductor layer 110 is 1.4 µm and the impurity diffusion depth of the n-type semiconductor region 108b provided at the position opposed to the n-type semiconductor layer 111 is 0.5 µm. The impurity concentration of both the n-type semiconductor region 108a and the n-type semiconductor region 108b is approximately $1 \times 10^{18}$ cm$^{-3}$. In the photoelectric conversion device 101 in which the FSF region is formed by diffusing impurity, the impurity diffusion depth (impurity penetration depth) in the FSF region corresponds to the thickness of the FSF region (the n-type semiconductor region 108).

FIG. 6 is a cross-sectional view of the relevant parts schematically illustrating the flow of charge in the photoelectric conversion device 101 according to the second embodiment. In the back-contact photoelectric conversion device 101 in which all the collecting electrodes are formed on one surface side (back surface side) of the n-type crystalline silicon substrate 102, the charge generated in the n-type semiconductor region 108a located over the p-type semiconductor layer 110, i.e., located at the position opposed to the p-type semiconductor layer 110, moves in a direction parallel to the substrate surface of the n-type crystalline silicon substrate 102 and reaches the n-type semiconductor layer 111. In other words, because the electrical resistance of the n-type semiconductor region 108a is lower than that of the n-type crystalline silicon substrate 102, part of the charge generated in the substrate surface on the light receiving surface side of the n-type crystalline silicon substrate 102, on which a collecting electrode is not present, moves in the n-type semiconductor region 108a and, thereafter, moves in the thickness direction of the n-type crystalline silicon substrate 102 and reaches the n-type semiconductor layer 111. In FIG. 6, the flow of the charge that moves in the n-type semiconductor region 108a is indicated by a solid-line arrow M. In such a case, because the electrical resistance of the n-type semiconductor region 108a is lower than that of the n-type crystalline silicon substrate 102, the voltage loss due to the charge transfer is reduced compared with the case where the charge moves in a direction parallel to the substrate surface in the n-type crystalline silicon substrate 102. Therefore, the power generation efficiency is improved because of the charge transfer in the n-type semiconductor region 108a and thus the photoelectric conversion efficiency is improved.

In contrast, the impurity diffusion depth of the n-type semiconductor region 108b provided at the position opposed to the n-type semiconductor layer 111 is shallower than that of the n-type semiconductor region 108a. Typically, when the depth to which impurity is diffused in a semiconductor is shallow, the high-concentration impurity region is reduced and thus the average impurity concentration is reduced. Therefore, the charge loss due to recombination is reduced. The charge generated in the n-type semiconductor region 108b and near the n-type semiconductor region 108b mainly moves in the thickness direction of the n-type crystalline silicon substrate 102 and reaches the p-type semiconductor layer 110 and the n-type semiconductor layer 111; therefore, the resistance of the n-type semiconductor region 108b hardly contributes to the charge transfer. Therefore, by reducing the impurity diffusion depth of the n-type semiconductor region 108b, the charge loss due to recombination in the n-type semiconductor region 108b can be reduced without hindering the charge transfer and, as a result, the power generation current can be increased. In FIG. 6, the motion of the charge generated in the n-type semiconductor region 108b and near the n-type semiconductor region 108b is indicated by a broken-line arrow K.

As described above, the impurity diffusion depth of the n-type semiconductor region 108a in the photoelectric conversion device 101 is 1.4 µm and the impurity diffusion depth of the n-type semiconductor region 108b in the photoelectric conversion device 101 is 0.5 µm. The photoelectric conversion characteristics, derived assuming that the above conditions are applied, of the photoelectric conversion device 101 (example) according to the second embodiment and a conventional photoelectric conversion device (comparison example) are similar to those in FIG. 3 in the first embodiment. In other words, the power generation current is improved in the photoelectric conversion device 101 according to the second embodiment compared with that in the conventional photoelectric conversion device. This is because the charge loss in the n-type semiconductor region 108b is reduced in the photoelectric conversion device 101 according to the second embodiment. Therefore, in the photoelectric conversion device 101 according to the second embodiment, it becomes obvious that the photoelectric conversion efficiency is improved by reducing the impurity diffusion depth of the n-type semiconductor region 108b in the FSF region when compared with the conventional photoelectric conversion device that includes an n-type semiconductor region (FSF region) that has a uniform impurity diffusion depth.

The conventional photoelectric conversion device has the same configuration as that of the photoelectric conversion device 101 according to the second embodiment except for the inclusion of an n-type semiconductor region (FSF region) having a uniform impurity diffusion depth instead of the n-type semiconductor region 108 (FSF region) including the n-type semiconductor region 108a and the n-type semiconductor region 108b. The impurity diffusion depth of the n-type semiconductor region (FSF region) in the photoelectric conversion device of the comparison example is 200 nm.

Figures 4, 5, 6, 7:
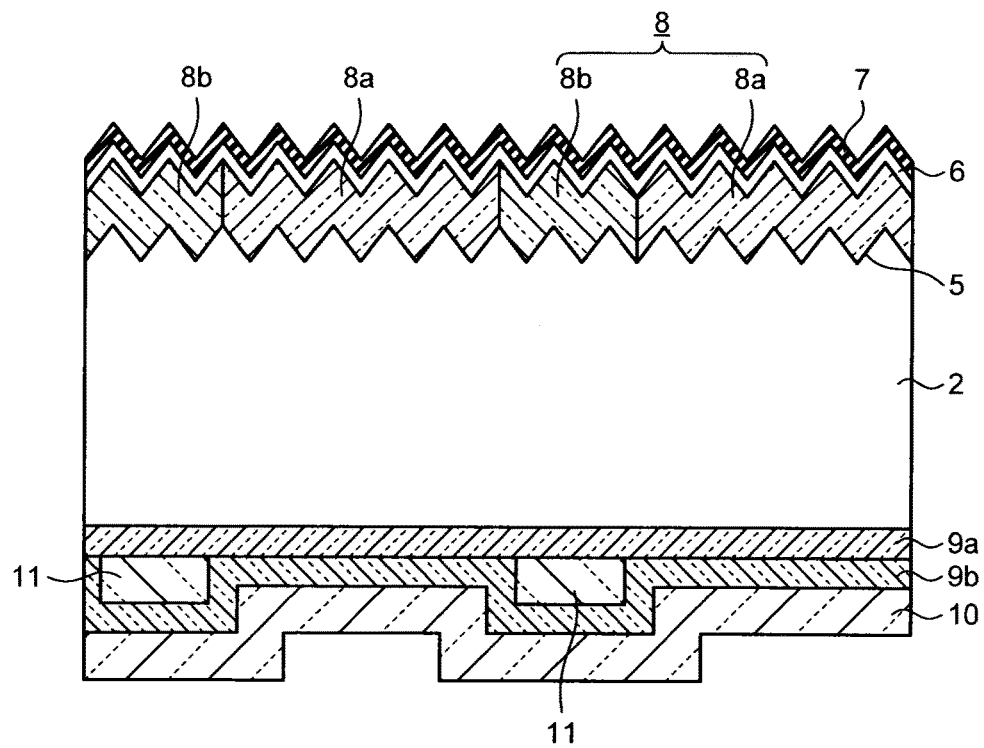

Next, the manufacturing method of the photoelectric conversion device 101 according to the second embodiment will be explained. FIG. 7-1 to FIG. 7-10 are cross-sectional views explaining the procedure of the manufacturing method of the photoelectric conversion device 101 according to the second embodiment. First, as illustrated in FIG. 7-1, the texture structure 105 composed of microasperities, called a texture, is formed on the light receiving surface side of the n-type crystalline silicon substrate 102. The microasperities are formed by using acid or alkaline etching solution. At this point, the other surface side of the n-type crystalline silicon substrate 102 is covered with resin, such as a resist, a dielectric film, or the like so that the texture structure is not formed on the other surface side of the n-type crystalline silicon substrate 102. Before the microasperities are formed, the process of removing the damaged layer on the surface of the n-type crystalline silicon substrate 102 may be performed. In addition to the above, after the process of removing the damaged layer, it is desirable to perform a gettering process of the impurity in the n-type crystalline silicon substrate 102 in order to improve the performance of the photoelectric conversion device. For example, a phosphorus diffusion process is used as the gettering process.

After the texture structure 105 is formed, as illustrated in FIG. 7-2, in order to diffuse phosphorus (P), a phosphorus diffusion source 114, such as POCl$_3$, is formed over the entire surface on the light receiving surface side of the n-type crystalline silicon substrate 102 and a heat treatment (phosphorus diffusion process) is performed at a temperature of, for example, 750° C. or higher. Accordingly, phosphorus (P) is diffused into the surface on the light receiving surface side of the n-type crystalline silicon substrate 102 and thus the n-type semiconductor region 108b is formed in the surface layer on the light receiving surface side of the n-type crystalline silicon substrate 102. At this point, the concentration of phosphorus (P) diffused into the surface on the light receiving surface side of the n-type crystalline silicon substrate 102 can be controlled by adjusting the temperature and the treatment time of the heat treatment. Thereafter, the phosphorus diffusion source 114 is removed.

Next, as illustrated in FIG. 7-3, phosphorus (P) is further diffused into the n-type crystalline silicon substrate 102 by selectively irradiating, with laser light L, only the region in the n-type semiconductor region 108b opposed to the region in which the p-type semiconductor layer 110 is to be formed on the back surface side of the n-type crystalline silicon substrate 102 and heating the n-type semiconductor region 108b. Accordingly, a phosphorus (P) diffusion distribution with a large diffusion depth is formed in the surface layer on the light receiving surface side of the n-type crystalline silicon substrate 102. A phosphorus (P) diffusion distribution with a large diffusion depth may be formed by selectively irradiating, with a phosphorus (P) ion beam, only the n-type semiconductor region 108b in the region opposed to the region in which the p-type semiconductor layer 110 is to be formed instead of irradiating the n-type semiconductor region 108b with the laser light L and reactivating phosphorus (P) diffusion.

Next, as illustrated in FIG. 7-4, the passivation film 106 and the anti-reflective film 107 are formed, in the order they appear in this sentence, on the surface on the light receiving surface side of the n-type crystalline silicon substrate 102 having the texture structure 105 by using a CVD method. For example, a silicon oxide film, a silicon nitride film, or the like is used as the passivation film 106. An n-type amorphous silicon film, an n-type microcrystalline silicon thin film, or the like having the same conductivity type as that of the n-type crystalline silicon substrate 102 may be used as the passivation film 106. Furthermore, a laminated film of an intrinsic amorphous silicon film and an n-type amorphous silicon film or an n-type microcrystalline silicon film may be used as the passivation film 106. The film thickness of the passivation film 106 at this point is preferably 5 nm or more and 20 nm or less in order to suppress light absorption in the passivation film 106. It is advisable to use a plasma CVD method, a thermal CVD method, or the like as the CVD method. For example, a silicon oxide film, a silicon nitride film, or a laminated film thereof is used as the anti-reflective film 107. When the passivation film 106 is a silicon oxide film or a silicon nitride film, this film may also serve as an anti-reflective film.

Next, as illustrated in FIG. 7-5, the passivation film 109a and the n-type semiconductor layer 111 are formed, in the order they appear in this sentence, on the back surface side of the n-type crystalline silicon substrate 102, on which the texture structure 105 is not formed. For example, an intrinsic amorphous silicon film, an intrinsic microcrystalline silicon film, or the like is used as the passivation film 109a. For example, an amorphous silicon film or a microcrystalline silicon film, doped with phosphorus (P), is used as the n-type semiconductor layer 111. The film thickness of the n-type semiconductor layer 111 is preferably 20 nm or less in order to suppress optical loss in the n-type semiconductor layer 111. At this point, before the passivation film 109a is formed, it is preferable to clean the back surface of the n-type crystalline silicon substrate 102 with hydrofluoric acid (HF), hydrochloric acid (HCL) to which hydrogen peroxide solution ($H_2O_2$) is added, ammonia ($NH_3$) solution, or the like. The film thickness of the passivation film 109a is, for example, preferably 2 nm to 5 nm.

After the passivation film 109a and the n-type semiconductor layer 111 are formed, as illustrated in FIG. 7-6, necessary portions of the n-type semiconductor layer 111 are covered with a resist 117 and unnecessary portions of the n-type semiconductor layer 111 are removed. The plane arrangement pattern of the resist 117 at this point is of such a shape that the width thereof is larger by approximately 50 µm to 100 µm than that of the pattern of the collecting electrode 104 as illustrated in FIG. 5-2. As a method of removing the unnecessary portions of the n-type semiconductor layer 111, for example, wet etching, plasma etching, etching paste, or the like is used. At this point, the passivation film 109a is prevented from being removed. Thereafter, the resist 117 is removed. Instead of covering the necessary portions of the n-type semiconductor layer 111 with the resist 117 and performing etching, the unnecessary portions of the n-type semiconductor layer 111 may be removed by printing etching paste on the unnecessary portions of the n-type semiconductor layer 111.

Next, as illustrated in FIG. 7-7, the passivation film 109b and the p-type semiconductor layer 110 doped with boron (B) are formed, in the order they appear in this sentence, on the back surface side of the n-type crystalline silicon substrate 102. For example, an intrinsic amorphous silicon film, an intrinsic microcrystalline silicon film, or the like is used as the passivation film 109b. An amorphous silicon film or a microcrystalline silicon film, doped with boron (B), is used as the p-type semiconductor layer 110. The film thickness of the passivation film 109b is, for example, preferably 2 nm to 5 nm. In addition to this, the film thickness of the p-type semiconductor layer 110 is preferably 10 nm or less in order to suppress optical loss in the p-type semiconductor layer 110.

Figures 4, 5, 6, 7, 8:
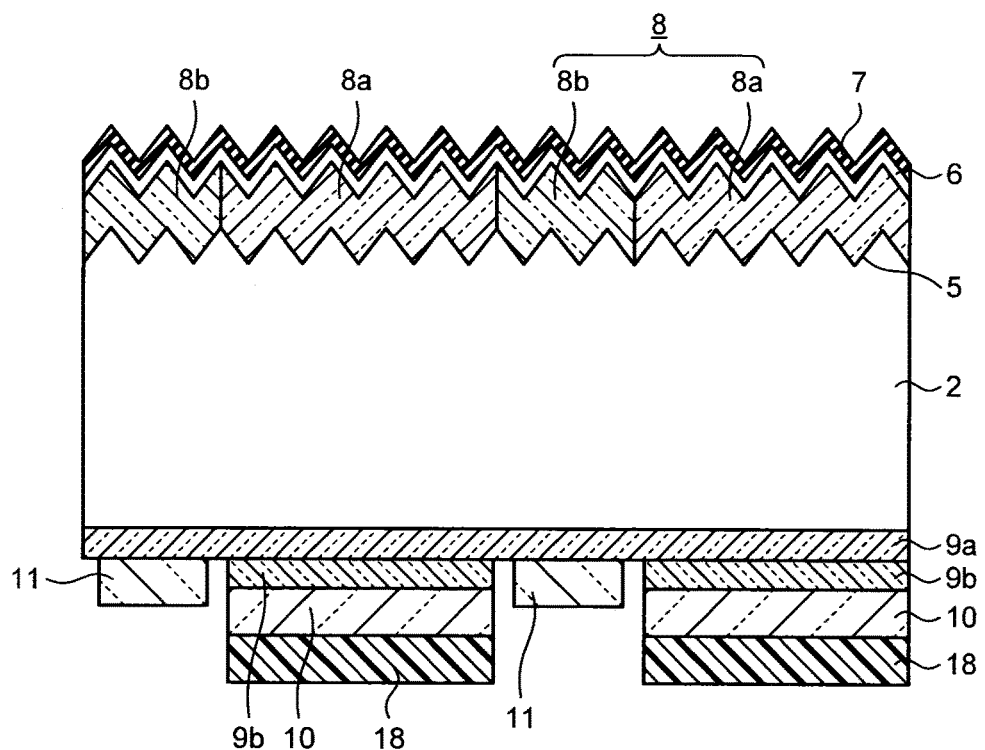

After the passivation film 109b and the p-type semiconductor layer 110 are formed, as illustrated in FIG. 7-8, necessary portions of the p-type semiconductor layer 110 are covered with a resist 118 and unnecessary portions of the passivation film 109b and the p-type semiconductor layer 110 are removed. The plane arrangement pattern of the resist 118 at this point is of such a shape that the width thereof is larger by approximately 50 µm to 100 µm than that of the pattern of the collecting electrode 103 as illustrated in FIG. 5-2. As a method of removing the unnecessary portions of the passivation film 109b and the p-type semiconductor layer 110, for example, wet etching, plasma etching, etching paste, or the like is used. At this point, the n-type semiconductor layer 111 and the passivation film 109a are prevented from being removed. Thereafter, the resist 118 is removed. Instead of covering the necessary portions of the p-type semiconductor layer 110 with the resist and performing etching, the unnecessary portions of the passivation film 109b and the p-type semiconductor layer 110 may be removed by printing etching paste on the unnecessary portions of the p-type semiconductor layer 110.

Figures 4, 5, 6, 7, 8, 9:
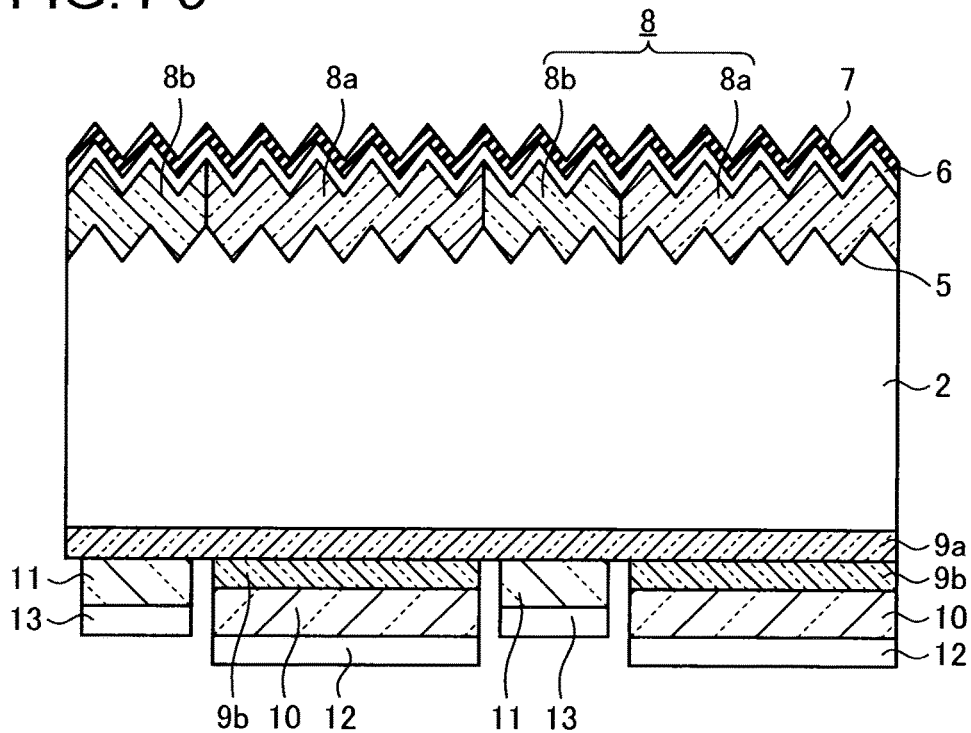

Next, a transparent conductive film is formed on the back surface side of the n-type crystalline silicon substrate 102 by a sputtering method or the like. Thereafter, the transparent conductive film other than that in the regions on the p-type semiconductor layer 110 and the n-type semiconductor layer 111 is removed by using etching paste. Accordingly, as illustrated in FIG. 7-9, the transparent electrode 112 is formed on the p-type semiconductor layer 110 and the transparent electrode 113 is formed on the n-type semiconductor layer 111. As the transparent conductive film, for example, indium oxide ($In_2O_3$: Indium Oxide), indium oxide doped with tin (ITO: Indium Tin Oxide), zinc oxide (ZnO: Zinc Oxide), or the like is used. Before the transparent conductive film is formed, a heat treatment may be performed on the n-type crystalline silicon substrate 102 at a temperature of approximately 200° C. in order to improve the defect passivation effect of the passivation film.

Next, as illustrated in FIG. 7-10, the collecting electrode 103 is formed on the transparent electrode 112 and the collecting electrode 104 is formed on the transparent electrode 113. The collecting electrode 103 and the collecting electrode 104 are formed by printing, for example, silver (Ag) paste. The collecting electrode 103 and the collecting electrode 104 may be formed by metal plating using copper (Cu) or the like instead of silver paste (Ag). By performing the processes described above, the photoelectric conversion device 101 according to the second embodiment having the configuration illustrated in FIG. 5-1 to FIG. 5-3 is obtained. The forming of the light receiving surface side and the back surface side of the photoelectric conversion device 101 may be performed in the opposite order.

As described above, in the photoelectric conversion device 101 according to the second embodiment, the impurity diffusion depth of the n-type semiconductor region 108b is made shallower than that of the n-type semiconductor region 108a, whereby the average impurity concentration of the n-type semiconductor region 108b is made lower than that of the n-type semiconductor region 108a. The n-type semiconductor region 108b is an FSF region that does not contribute to the transfer of the charge generated in the substrate surface on the light receiving surface side of the n-type crystalline silicon substrate 102 and is provided at the position opposed to the n-type semiconductor layer 111 with the n-type crystalline silicon substrate 102 therebetween. Typically, when the impurity concentration of a semiconductor is reduced, the charge loss due to recombination is reduced. In the photoelectric conversion device 101, the average impurity concentration of the n-type semiconductor region 108b is reduced; therefore, the charge loss due to recombination in the n-type semiconductor region 108b is reduced. In contrast, while the n-type semiconductor region 108a, which is an FSF region provided at the position opposed to the p-type semiconductor layer 110, has a role of conducting the generated charge to the n-type semiconductor layer 111, the charge generated in the n-type semiconductor region 108b and near the n-type semiconductor region 108b is conducted only in the direction substantially vertical to the substrate surface; therefore, the n-type semiconductor region 108b does not contribute to the charge conduction. Accordingly, in the photoelectric conversion device 101, the power generation current is increased while maintaining the conduction of the charge by the FSF region; therefore, a photoelectric conversion device having a high photoelectric conversion efficiency is realized.

Thus, according to the second embodiment, an effect is obtained where it is possible to realize a back-contact photoelectric conversion device that offers high power generation current and has excellent photoelectric conversion efficiency.

Third Embodiment

FIG. 8-1 is a perspective view of the schematic configuration of a photoelectric conversion device 201 according to a third embodiment of the present invention viewed from the back surface side opposite to the light receiving surface. FIG. 8-2 is an expanded plan view of part of the back surface side of the photoelectric conversion device 201 and is an expanded plan view of region P in FIG. 8-1. FIG. 8-3 is a cross-sectional view of the schematic configuration of the photoelectric conversion device 201 and is a cross-sectional view taken along line Q-Q' in FIG. 8-2. As illustrated in FIG. 8-1 to FIG. 8-3, in the photoelectric conversion device 201, on the back surface side that is opposite to the light receiving surface of an n-type crystalline silicon substrate 202, a p-type semiconductor layer 210 doped with boron (B), a transparent electrode 212, and a collecting electrode 203 thinned into a comb shape are formed in the order they appear in this sentence and an n-type semiconductor layer 211 doped with phosphorus (P), a transparent electrode 213, and a collecting electrode 204 thinned into a comb shape are formed in the order they appear in this sentence.

The collecting electrode 203 and the collecting electrode 204 are interdigitated in such a way that their respective comb-shaped thinned portions are alternately arranged at regular intervals in the plane direction of the back surface of the photoelectric conversion device 201, and the comb-shaped thinned portions of the collecting electrode 203 and the collecting electrode 204 are connected at their respective one end portions. In FIG. 8-2, only one end portion of the collecting electrode 203 out of the one end portions of the collecting electrode 203 and of the collecting electrode 204 is illustrated; however, the comb-shaped thinned portions of the collecting electrode 204 are also connected at one end portion on the opposite side (not illustrated) in a similar manner. In the photoelectric conversion device 201, solar light N enters the light receiving surface that is the surface of the n-type crystalline silicon substrate 202 and is a different surface from the surface on which the collecting electrode 203 and the collecting electrode 204 are formed.

Next, a detailed configuration of the photoelectric conversion device 201 will be explained with reference to FIG. 8-3. The cross-sectional view illustrated in FIG. 8-3 is inverted for the purposes of the explanation. In other words, the solar light N enters the photoelectric conversion device 201 from above in FIG. 8-3. The n-type crystalline silicon substrate 202 has a specific resistance of 1 to 10 Ω·cm and has a thickness of 50 µm or more and 300 µm or less. A texture structure 205 composed of microasperities, called a texture, is formed on the surface on the light receiving surface side of the n-type crystalline silicon substrate 202.

An n-type semiconductor region 208a, an n-type semiconductor region 208b, and an n-type semiconductor region 208c are formed as an FSF region on the surface layer on the light receiving surface side of the n-type crystalline silicon substrate 202. Due to the FSF effect, the n-type semiconductor region 208a, the n-type semiconductor region 208b, and the n-type semiconductor region 208c have a role of returning the charge generated in the n-type crystalline silicon substrate 202 into the n-type crystalline silicon substrate 202. An n-type semiconductor layer 214 highly doped with phosphorus (P) is formed on the n-type semiconductor region 208a. A passivation film 206 and an anti-reflective film 207, each composed of a single layer film or a laminated film of two or more layers, are formed on the n-type semiconductor layer 214 and the n-type semiconductor region 208b in the order they appear in this sentence.

A passivation film 209a is formed on the other surface (back surface) side of the n-type crystalline silicon substrate 202, on which the texture structure 205 is not formed. In part of the region on the passivation film 209a, a passivation film 209b, the p-type semiconductor layer 210 doped with boron (B), the transparent electrode 212, and the collecting electrode 203 thinned into a comb shape are formed in the order they appear in this sentence. In the other part of the region on the passivation film 209a, the n-type semiconductor layer 211 doped with phosphorus (P), the transparent electrode 213, and the collecting electrode 204 thinned into a comb shape are formed in the order they appear in this sentence.

As described above, the collecting electrode 203 and the collecting electrode 204 are interdigitated in such a way that their respective comb-shaped thinned portions are alternately arranged at regular intervals above the passivation film 209a, and the comb-shaped thinned portions of the collecting electrode 203 and the collecting electrode 204 are connected at their respective one end portions. The passivation film 209b, the p-type semiconductor layer 210, and the transparent electrode 212 have substantially the same shape as the comb-shaped collecting electrode 203 in the plane direction of the n-type crystalline silicon substrate 202. The n-type semiconductor layer 211 and the transparent electrode 213 have substantially the same shape as the comb-shaped collecting electrode 204 in the plane direction of the n-type crystalline silicon substrate 202. The transparent electrode 212 is arranged between the p-type semiconductor layer 210 and the collecting electrode 203 so as to improve the electrical connection between the p-type semiconductor layer 210 and the collecting electrode 203. The transparent electrode 213 is arranged between the n-type semiconductor layer 211 and the collecting electrode 204 so as to improve the electrical connection between the n-type semiconductor layer 211 and the collecting electrode 204.

In the thickness direction of the FSF region, the n-type semiconductor region 208c is formed on the back surface side of the surface layer (FSF region) on the light receiving surface side of the n-type crystalline silicon substrate 202. In the plane direction of the n-type crystalline silicon substrate 202, the n-type semiconductor region 208c is formed with a substantially uniform thickness over the entire surface layer on the light receiving surface side of the n-type crystalline silicon substrate 202.

In the thickness direction of the FSF region, the n-type semiconductor region 208a is formed on the light receiving surface side of the surface layer (FSF region) on the light receiving surface side of the n-type crystalline silicon substrate 202. In the plane direction of the n-type crystalline silicon substrate 202, the n-type semiconductor region 208a is formed in part of the region on the n-type semiconductor region 208c to correspond to the position opposed to the p-type semiconductor layer 210 formed on the back surface side of the n-type crystalline silicon substrate 202. In the thickness direction of the FSF region, the n-type semiconductor region 208b is formed on the light receiving surface side of the surface layer (FSF region) on the light receiving surface side of the n-type crystalline silicon substrate 202. In the plane direction of the n-type crystalline silicon substrate 202, the n-type semiconductor region 208b is formed in part of the region on the n-type semiconductor region 208c and on the n-type semiconductor region 208c between the adjacent n-type semiconductor regions 208a to correspond the position opposed to the n-type semiconductor layer 211 formed on the back surface side of the n-type crystalline silicon substrate 202.

In the plane direction of the n-type crystalline silicon substrate 202, the n-type semiconductor region 208c is formed over the entire lower layer of the n-type semiconductor region 208a and the n-type semiconductor region 208b such that it covers the n-type semiconductor region 208a and the n-type semiconductor region 208b. For the sake of convenience, the n-type semiconductor region 208b and the n-type semiconductor region 208c are separately explained; however, the n-type semiconductor region 208b and the n-type semiconductor region 208c are formed simultaneously as a single layer as will be described later.

The n-type semiconductor region 208a, for example, has a substantially uniform thickness that is less than that of the n-type semiconductor region 208c and has an impurity concentration different from those of the n-type semiconductor region 208b and the n-type semiconductor region 208c. In other words, the n-type semiconductor region 208b and the n-type semiconductor region 208c have an impurity concentration lower than that of the n-type semiconductor region 208a. The n-type crystalline silicon substrate 202 has an impurity concentration lower than those of the n-type semiconductor region 208b and the n-type semiconductor region 208c. The n-type semiconductor region 208b, for example, has a substantially uniform thickness that is less than that of the n-type semiconductor region 208c and has an impurity concentration that is lower than that of the n-type semiconductor region 208a corresponding thereto in the thickness direction of the FSF region and is the same as that of the n-type semiconductor region 208c. The FSF region including the n-type semiconductor region 208a, the n-type semiconductor region 208b, and the n-type semiconductor region 208c has a thickness sufficient to exert the FSF effect as a whole.

In the photoelectric conversion device according to the third embodiment, the maximum impurity concentration of the n-type semiconductor region 208a provided at the position opposed to the p-type semiconductor layer 210 is $1 \times 10^{18}$ cm$^{-3}$ and the maximum impurity concentration of the n-type semiconductor region 208b provided at the position opposed to the n-type semiconductor layer 211 and the n-type semiconductor region 208c provided over the entire surface of the n-type crystalline silicon substrate 202 in the plane direction is $1 \times 10^{16}$ cm$^{-3}$. The average impurity concentration of the n-type semiconductor region 208a is approximately $0.5 \times 10^{18}$ cm$^{-3}$ and the average impurity concentration of the n-type semiconductor region 208b and the n-type semiconductor region 208c is approximately $0.5 \times 10^{16}$ cm$^{-3}$.

Therefore, in the FSF region in the photoelectric conversion device according to the third embodiment, the average impurity concentration of the region corresponding to the position opposed to the n-type semiconductor layer 211 in the plane direction of the n-type crystalline silicon substrate 202 is lower than the average impurity concentration of the region corresponding to the position opposed to the p-type semiconductor layer 210 in the plane direction of the n-type crystalline silicon substrate 202.

FIG. 9 is a cross-sectional view of the relevant parts schematically illustrating the flow of charge in the photoelectric conversion device 201 according to the third embodiment. In the back-contact photoelectric conversion device 201 in which all the collecting electrodes are formed on one surface side (back surface side) of the n-type crystalline silicon substrate 202, the charge generated in the n-type semiconductor region 208a located over the p-type semiconductor layer 210, i.e., located at the position opposed to the p-type semiconductor layer 210, moves in a direction parallel to the substrate surface of the n-type crystalline silicon substrate 202 and reaches the n-type semiconductor layer 211. In other words, because the electrical resistance of the n-type semiconductor region 208a is lower than that of the n-type crystalline silicon substrate 202, part of the charge generated in the substrate surface on the light receiving surface side of the n-type crystalline silicon substrate 202, on which a collecting electrode is not present, moves in the n-type semiconductor region 208a and, thereafter, moves in the thickness direction of the n-type crystalline silicon substrate 202 and reaches the n-type semiconductor layer 211. In FIG. 9, the flow of the charge that moves in the n-type semiconductor region 208a is indicated by a solid-line arrow R. In such a case, because the electrical resistance of the n-type semiconductor region 208a is lower than that of the n-type crystalline silicon substrate 202, the voltage loss due to the charge transfer is reduced compared with the case where the charge moves in a direction parallel to the substrate surface in the n-type crystalline silicon substrate 202. Therefore, the power generation efficiency is improved because of the charge transfer in the n-type semiconductor region 208a and thus the photoelectric conversion efficiency is improved.

In contrast, the n-type semiconductor region 208b provided at the position opposed to the n-type semiconductor layer 211 has an average impurity concentration lower than that of the n-type semiconductor region 208a. Typically, when the impurity concentration of a semiconductor is low, the charge loss due to recombination is reduced. The charge generated in the n-type semiconductor region 208b and near the n-type semiconductor region 208b mainly moves in the thickness direction of the n-type crystalline silicon substrate 202 and reaches the p-type semiconductor layer 210 and the n-type semiconductor layer 211; therefore, the resistance of the n-type semiconductor region 208b hardly contributes to the charge transfer. Therefore, by reducing the average impurity concentration of the n-type semiconductor region 208b, the charge loss due to recombination in the n-type semiconductor region 208b can be reduced without hindering the charge transfer and, as a result, the power generation current can be increased. Accordingly, the power generation efficiency is improved and thus the photoelectric conversion efficiency is improved. In FIG. 9, the motion of the charge generated in the n-type semiconductor region 208b and near the n-type semiconductor region 208b is indicated by a broken-line arrow S.

As described above, in the photoelectric conversion device 201, the maximum impurity concentration of the n-type semiconductor region 208a is approximately $1 \times 10^{18}$ $cm^{-3}$; the maximum impurity concentration of the n-type semiconductor region 208b is approximately $1 \times 10^{16}$ $cm^{-3}$; the average impurity concentration of the n-type semiconductor region 208a is approximately $0.5 \times 10^{18}$ $cm^{-3}$; and the average impurity concentration of the n-type semiconductor region 208b is approximately $0.5 \times 10^{16}$ $cm^{-3}$. The photoelectric conversion characteristics, derived assuming that the above conditions are applied, of the photoelectric conversion device 201 (example) according to the third embodiment and a conventional photoelectric conversion device (comparison example) are similar to those in FIG. 3 in the first embodiment. In other words, the power generation current is improved in the photoelectric conversion device 201 according to the third embodiment compared with that in the conventional photoelectric conversion device. This is because the charge loss in the n-type semiconductor region 208b is reduced in the photoelectric conversion device 201 according to the third embodiment. Therefore, in the photoelectric conversion device 201 according to the third embodiment, it becomes obvious that the photoelectric conversion efficiency is improved by reducing the impurity concentration of the n-type semiconductor region 208b in the FSF region when compared with the conventional photoelectric conversion device that includes an n-type semiconductor region (FSF region) that has a uniform impurity diffusion concentration.

The conventional photoelectric conversion device has the same configuration as that of the photoelectric conversion device 201 according to the third embodiment except for the inclusion of an n-type semiconductor region (FSF region) having the same thickness and a uniform average impurity concentration instead of the FSF region including the n-type semiconductor region 208a, the n-type semiconductor region 208b, and the n-type semiconductor region 208c. The average impurity concentration of the n-type semiconductor region (FSF region) in the photoelectric conversion device of the comparison example is $1 \times 10^{18}$ $cm^{-3}$.

Figures 4, 5, 6, 7, 8, 9, 10:
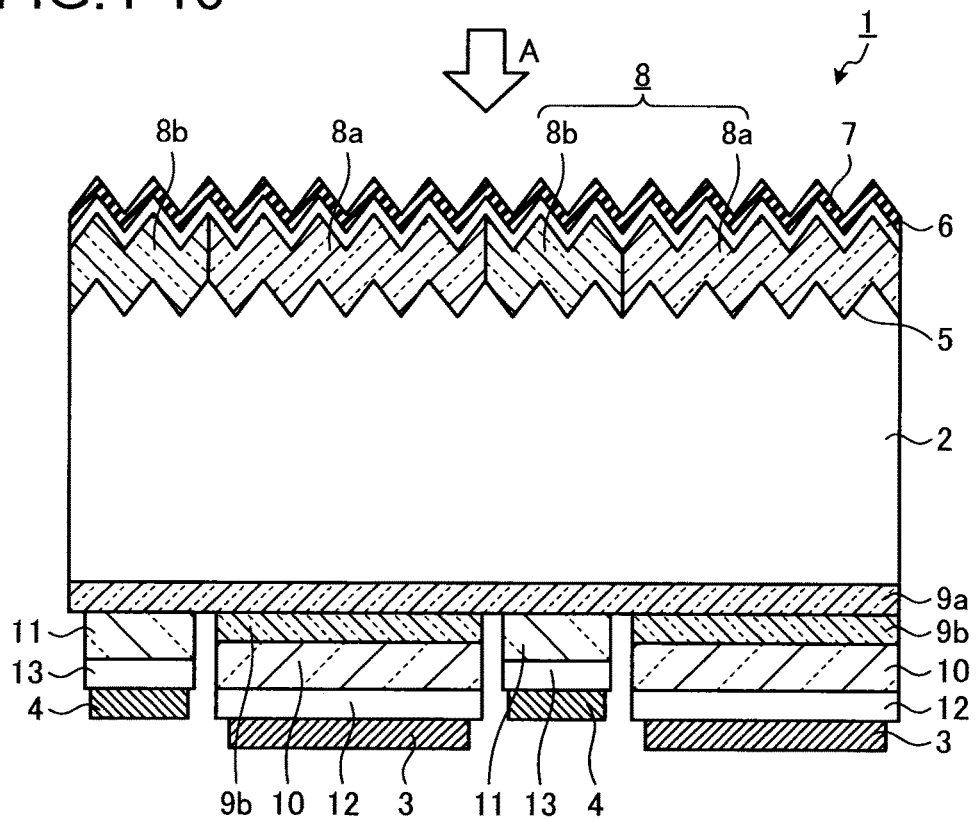
Figures 1, 5:
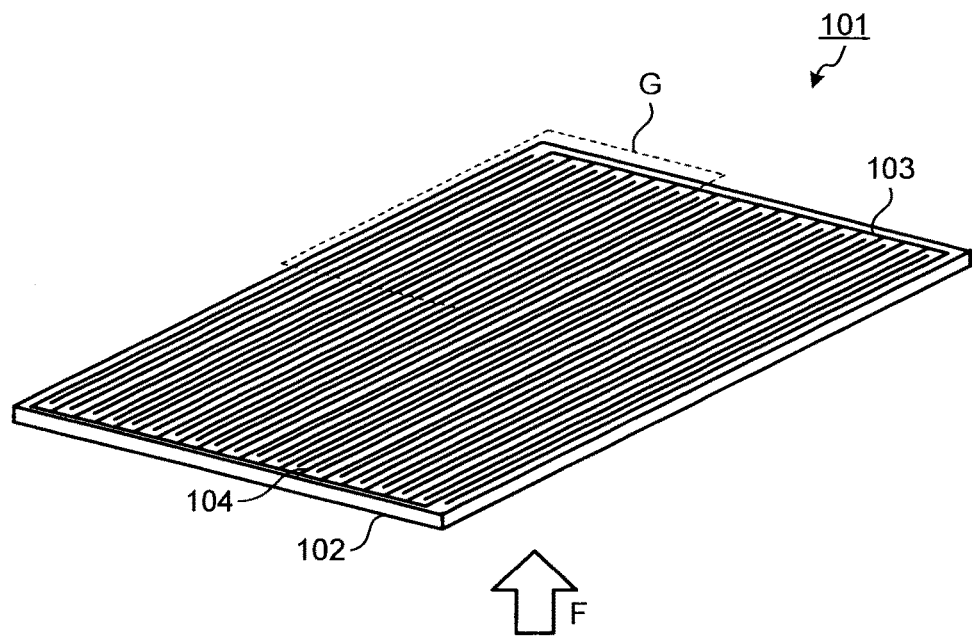
Figures 2, 5:
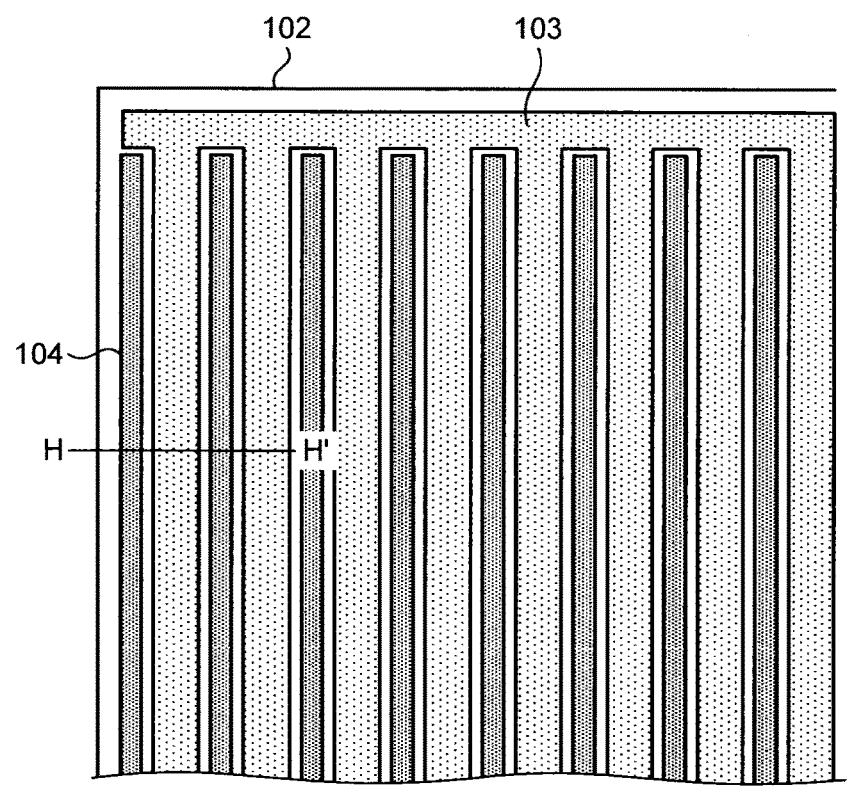
Figure 6:
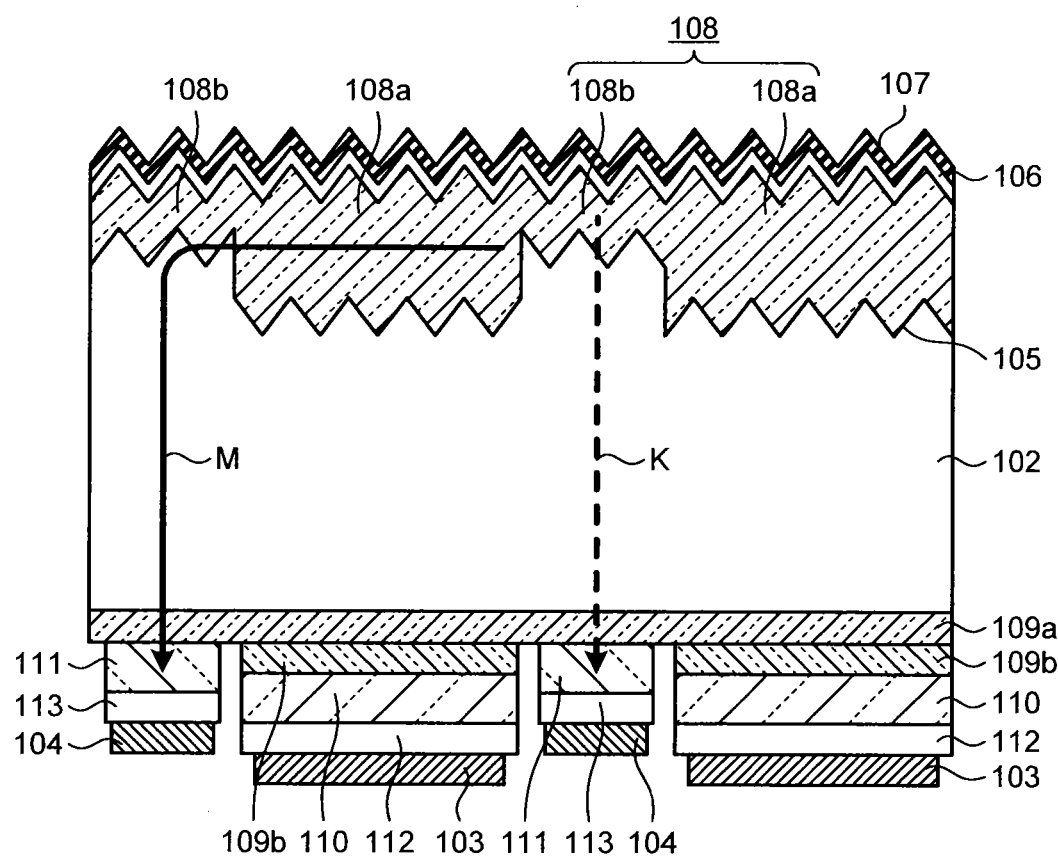
Figures 1, 7:
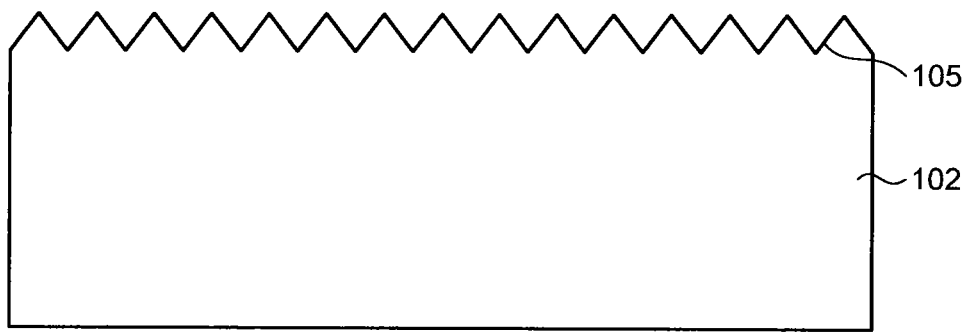
Figures 2, 7:
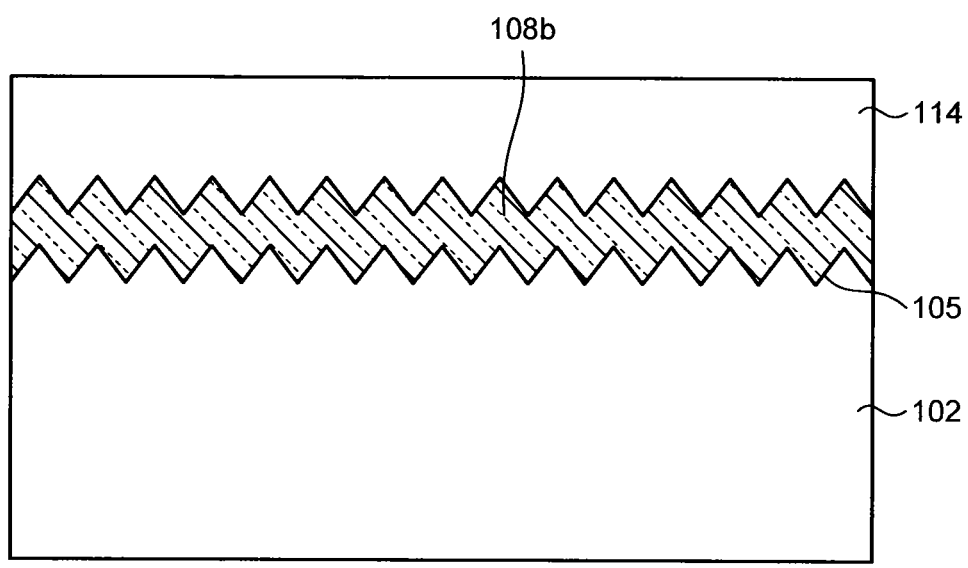
Figures 3, 7:
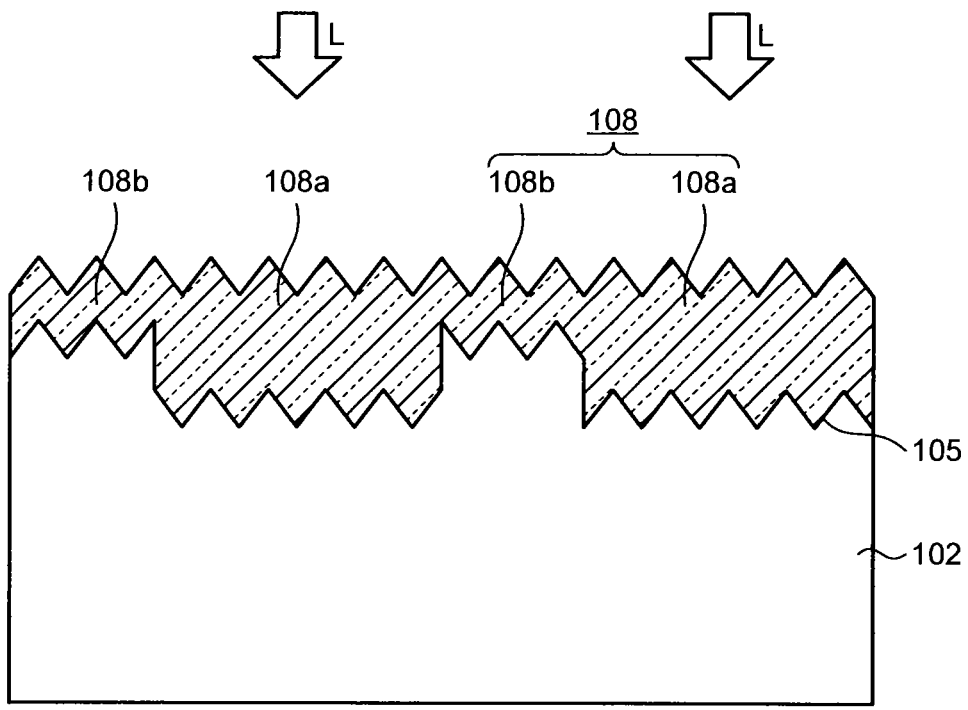
Figures 4, 7:
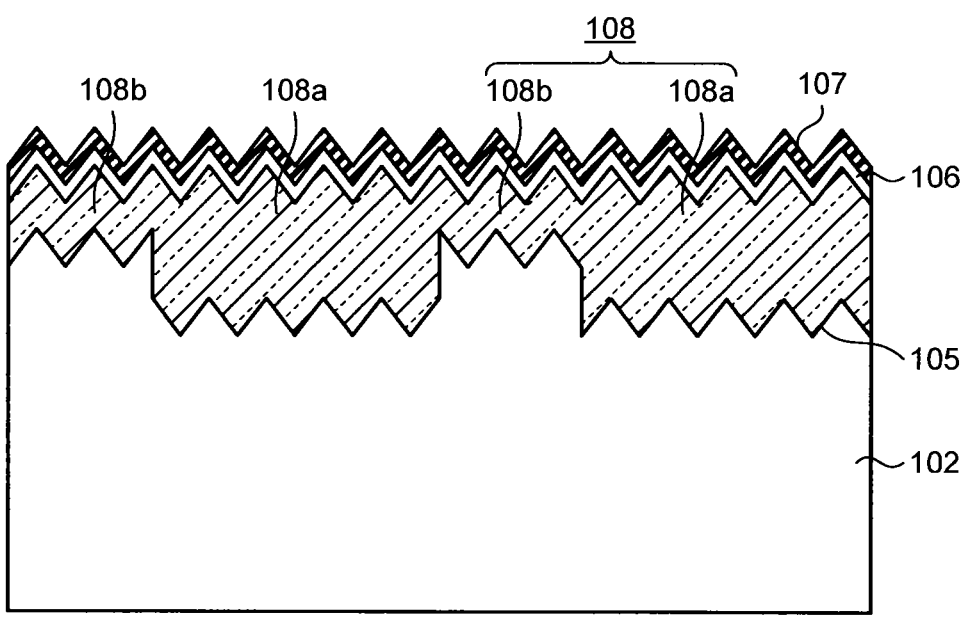
Figures 5, 7:
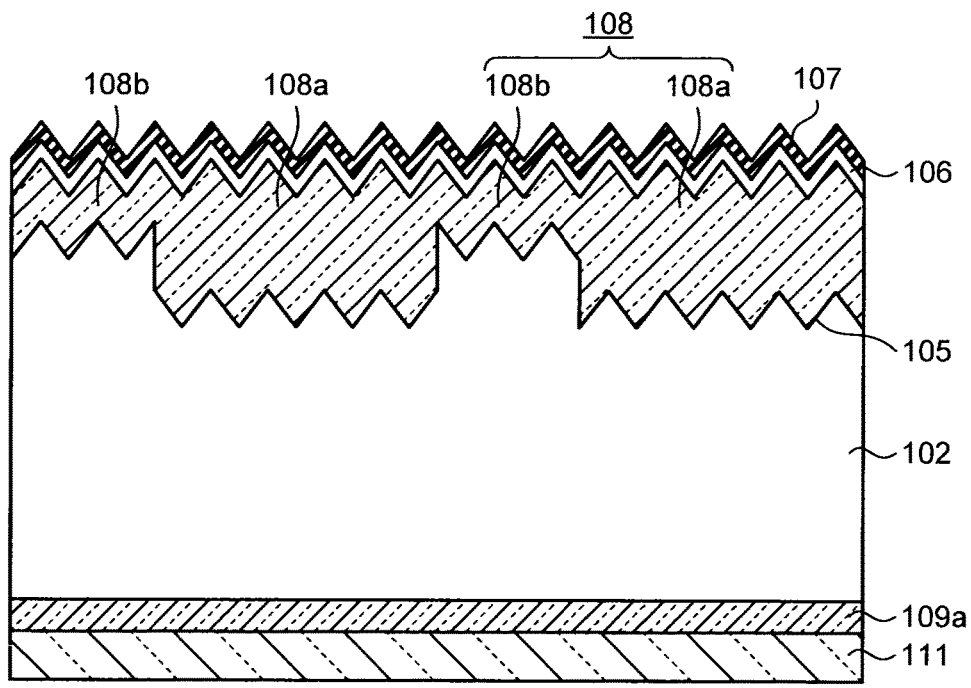
Figures 6, 7:
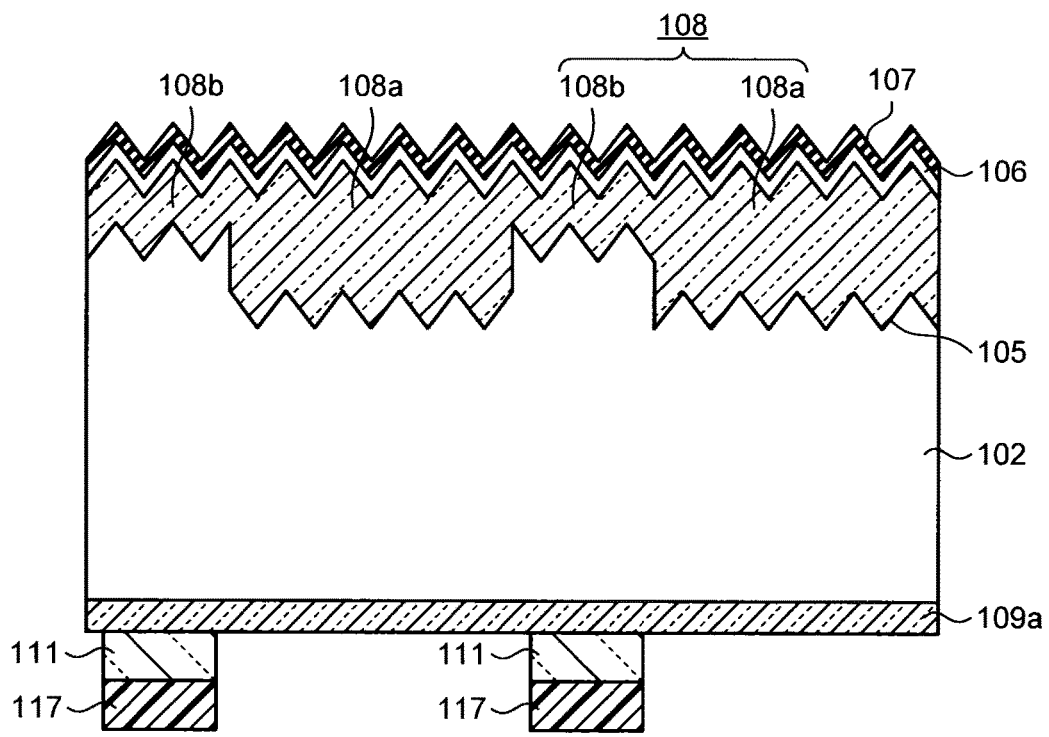
Figure 7:
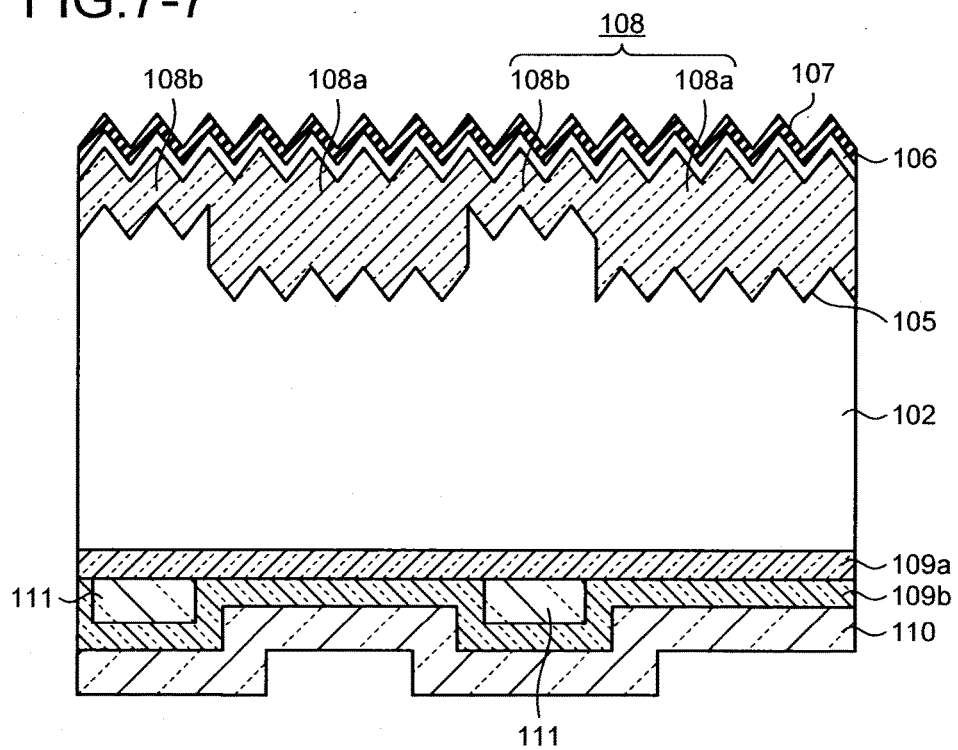
Figures 7, 8:
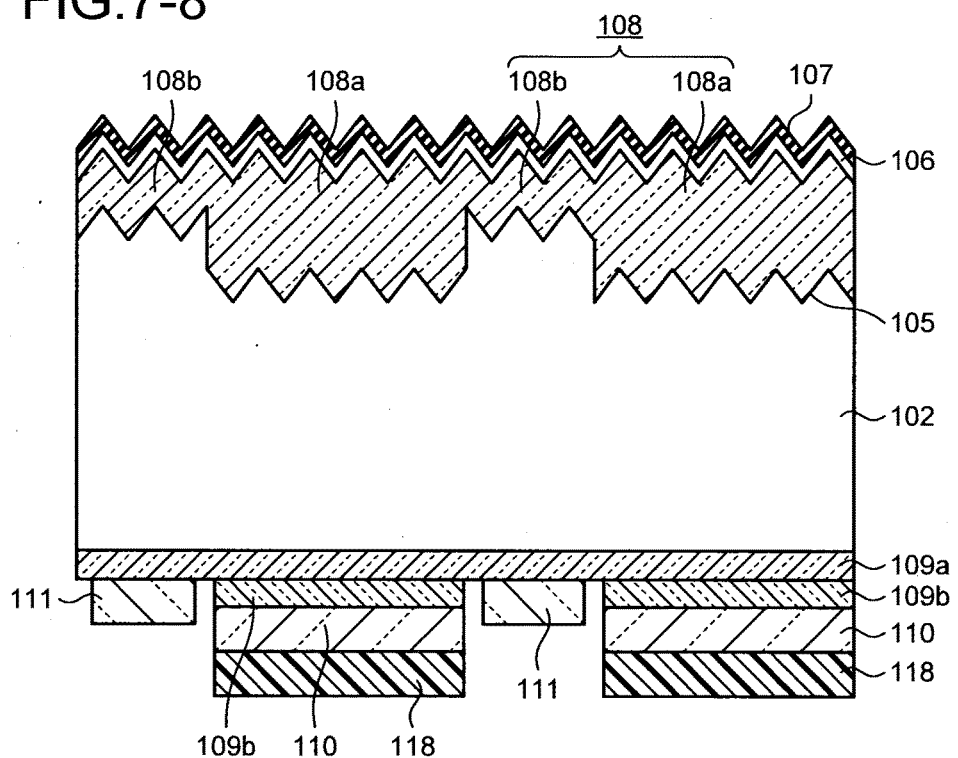
Figures 7, 8, 9:
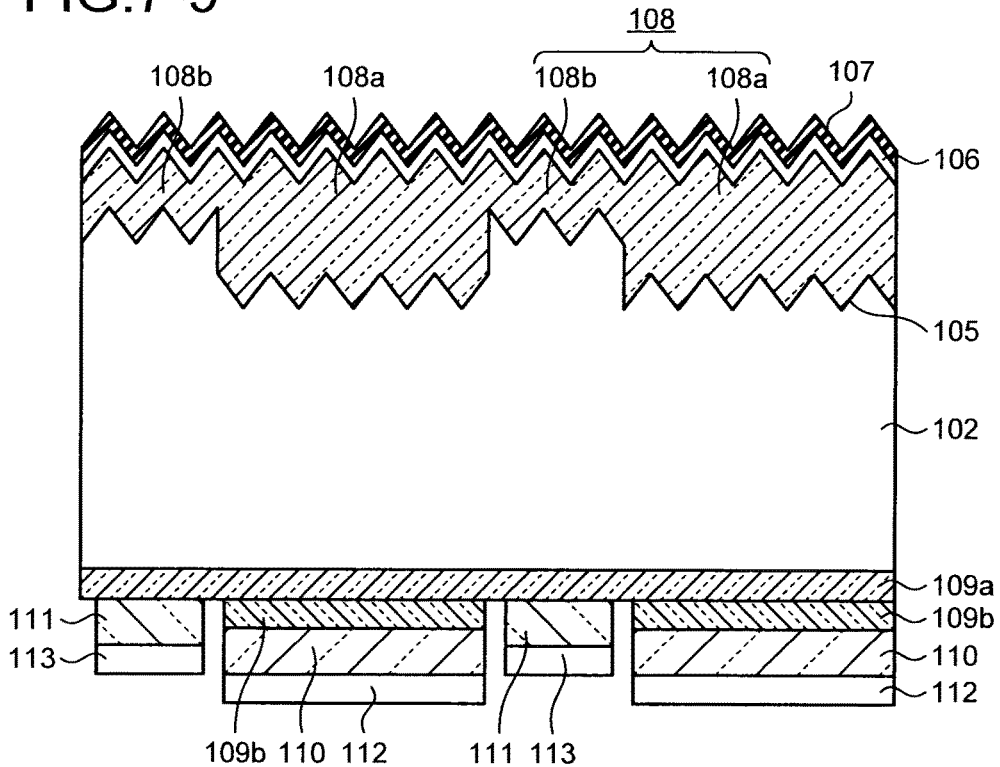
Figures 7, 8, 9, 10:
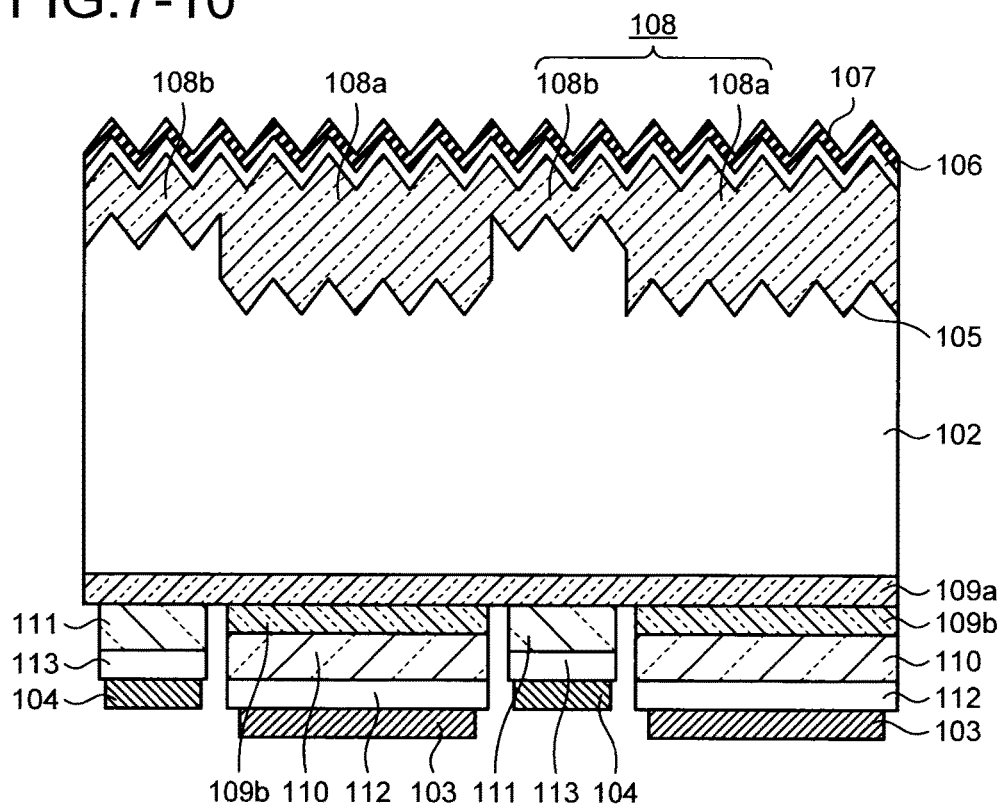
Figures 1, 8:
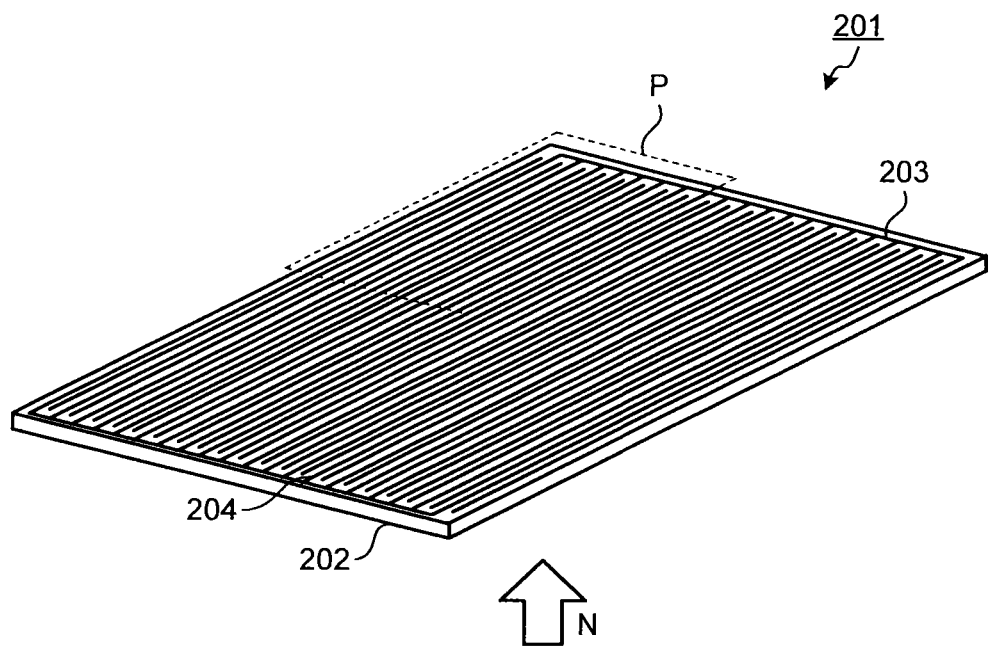
Figures 2, 8:
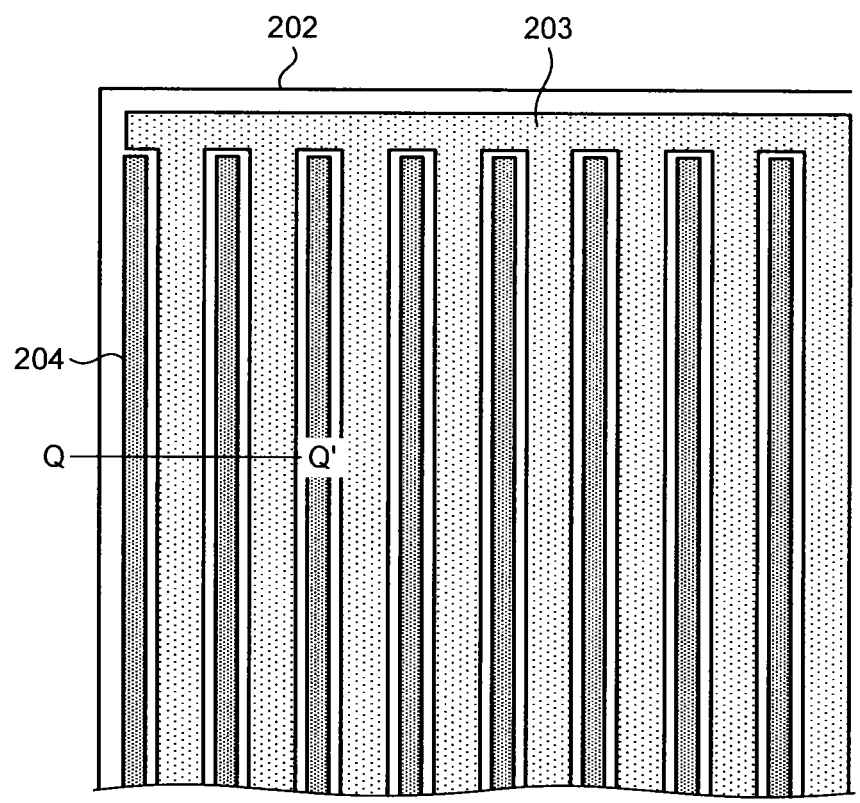
Figures 3, 8:
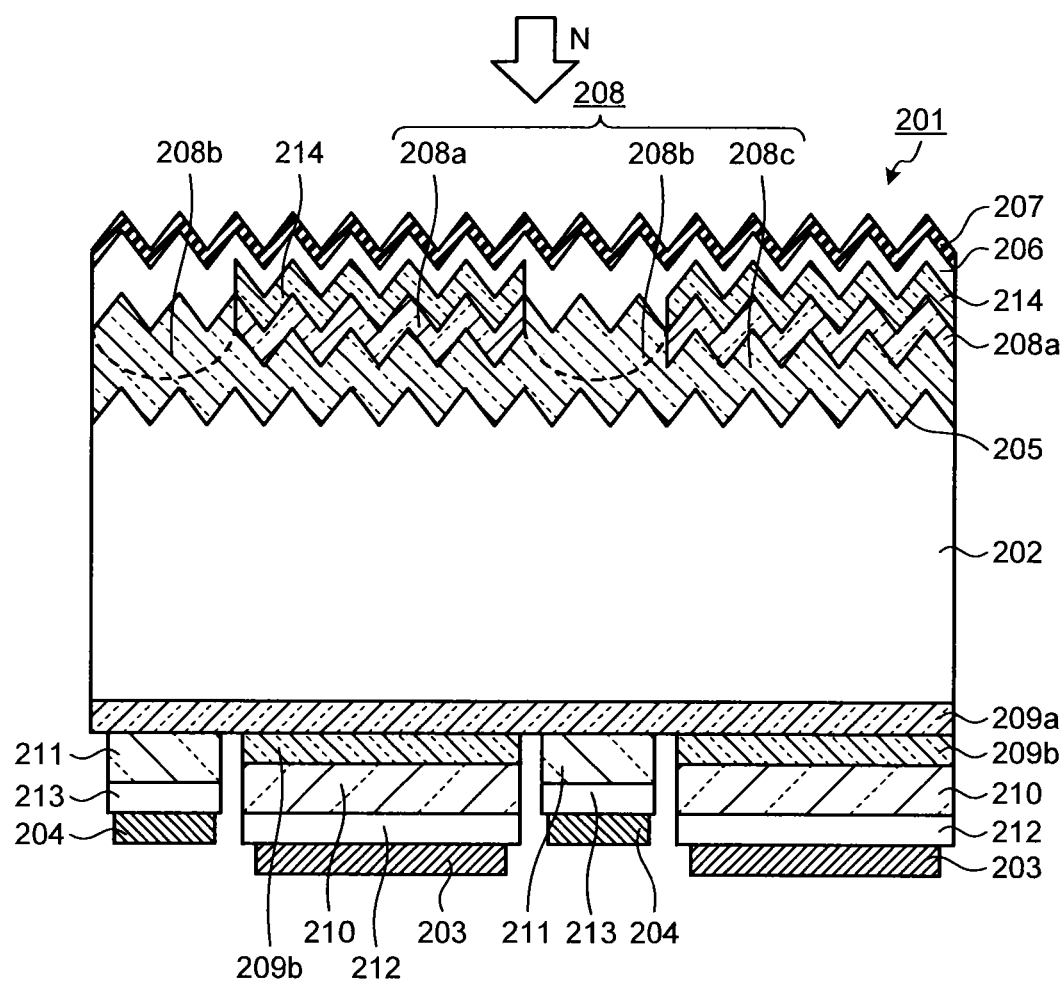
Figure 9:
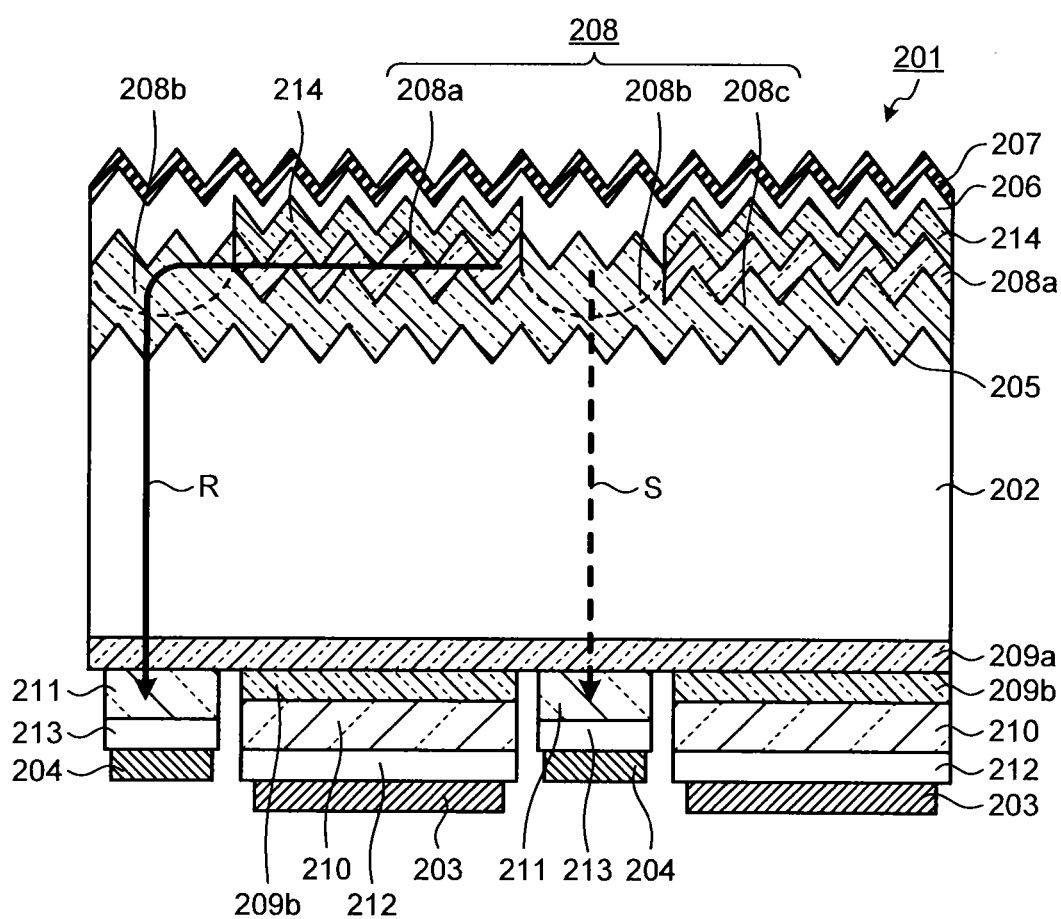
Figures 1, 10:
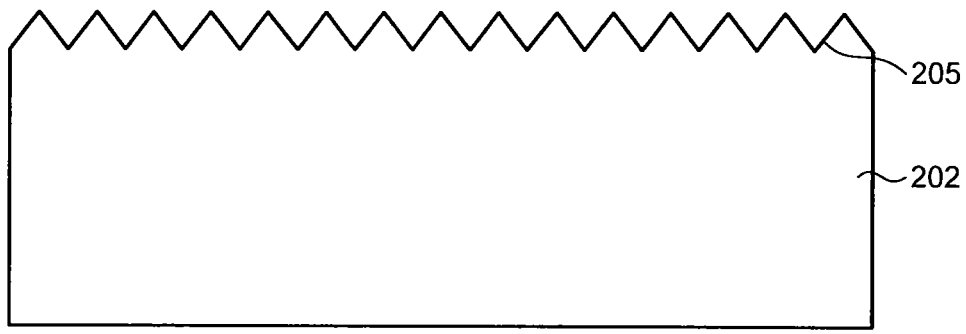
Figures 2, 10:
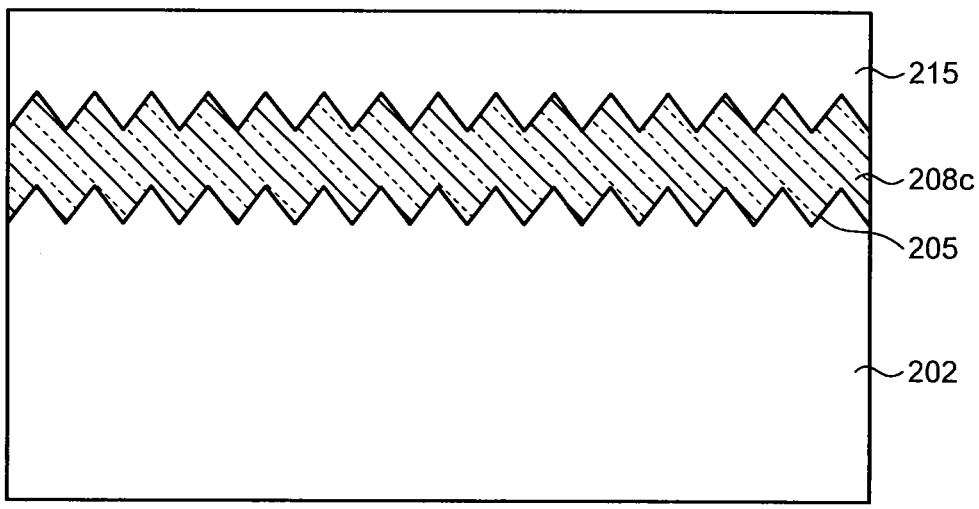
Figures 3, 10:
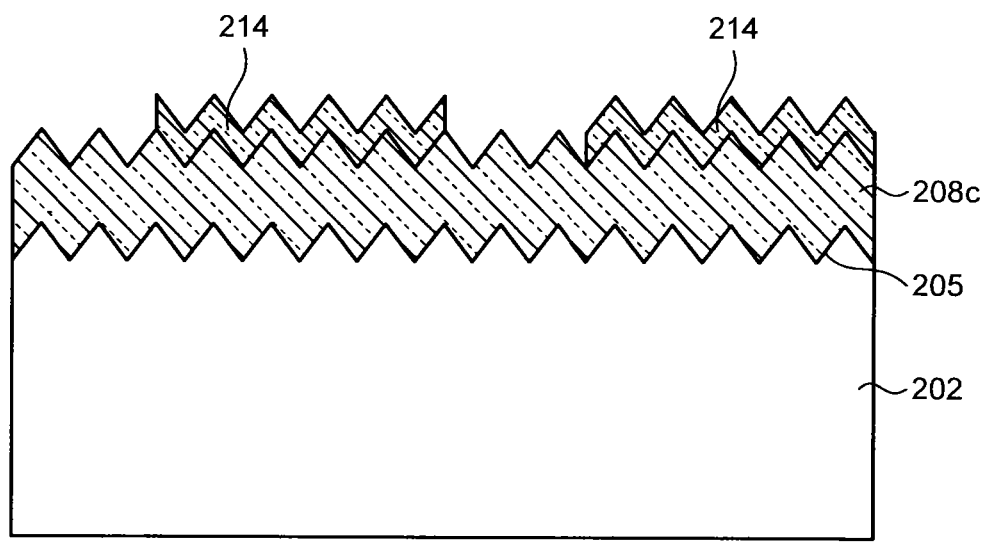
Figures 4, 10:
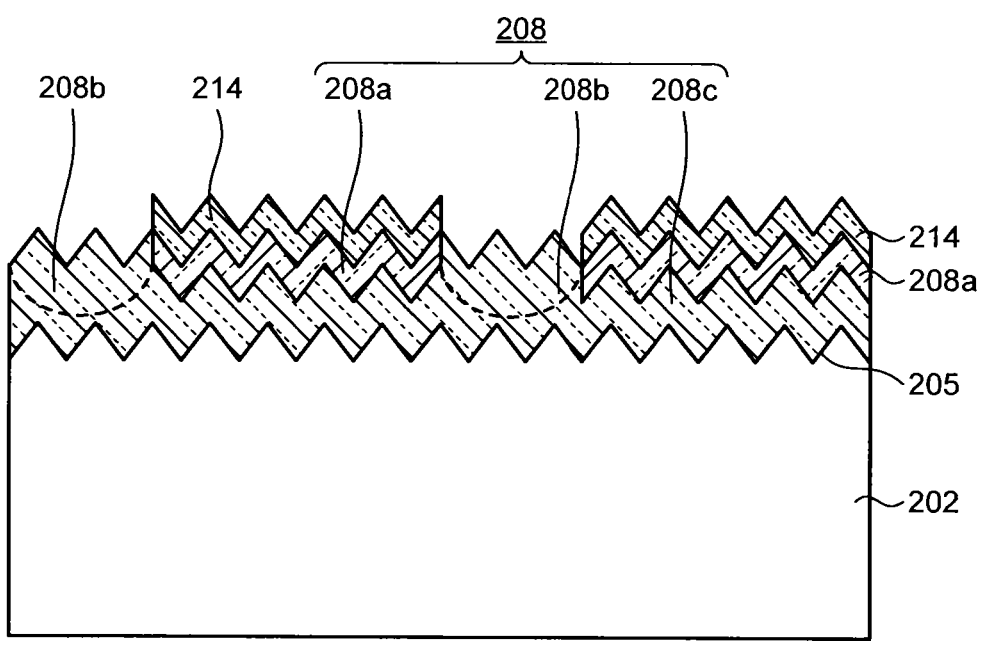
Figures 5, 10:
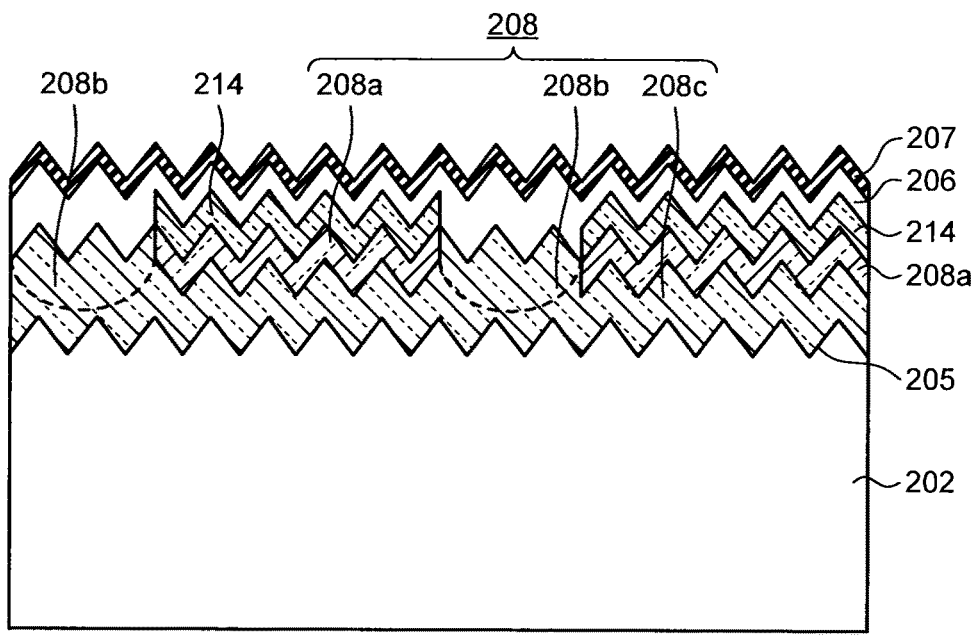
Figures 6, 10:
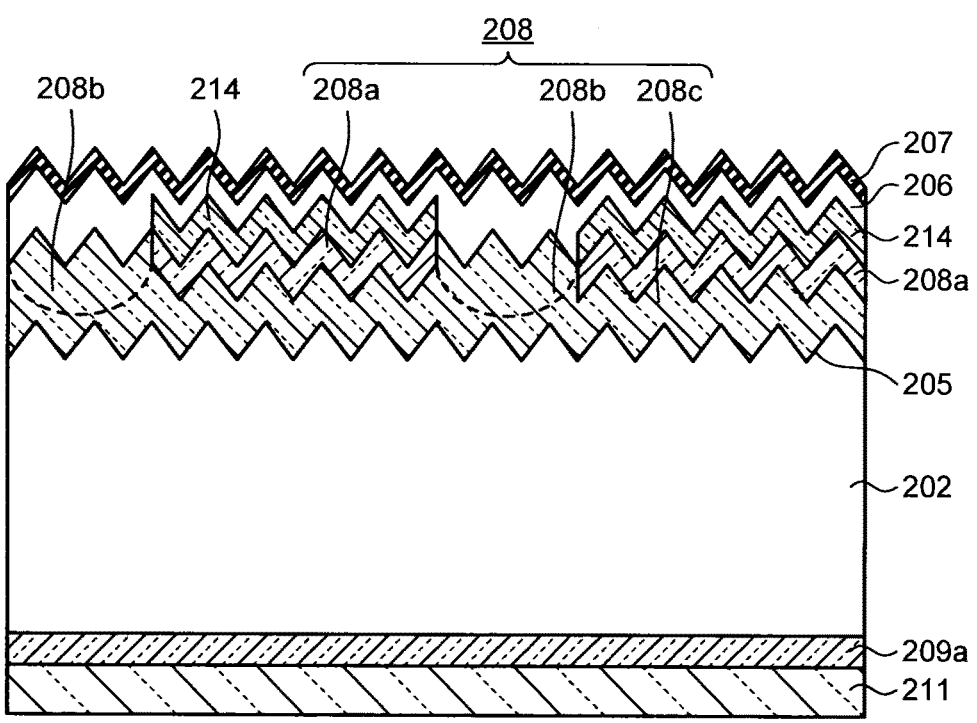
Figures 7, 10:
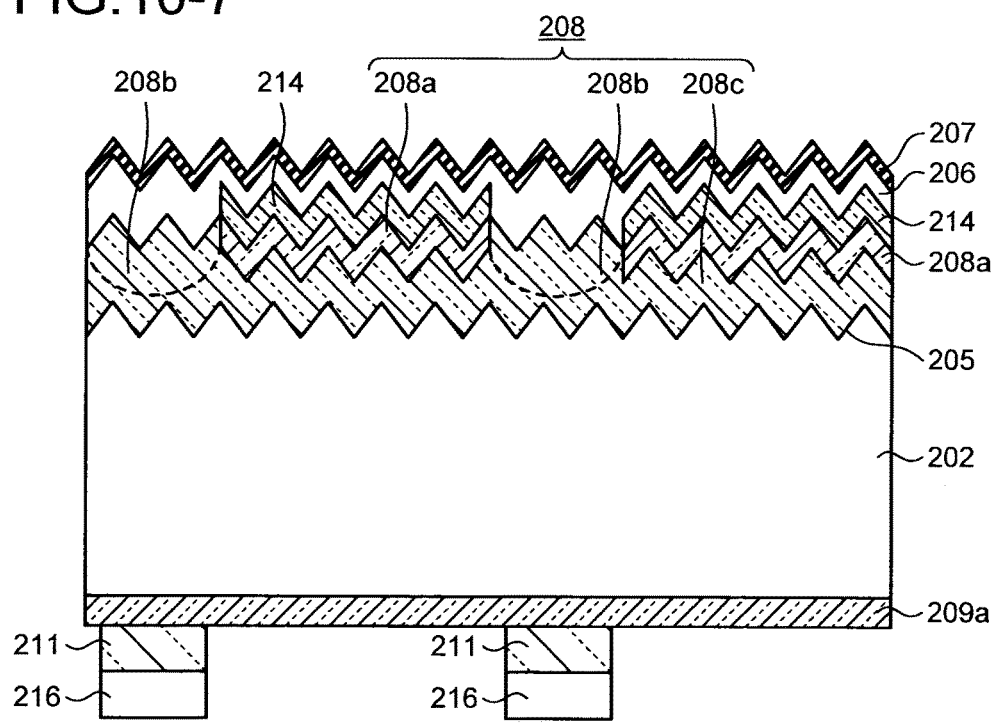
Figures 8, 10:
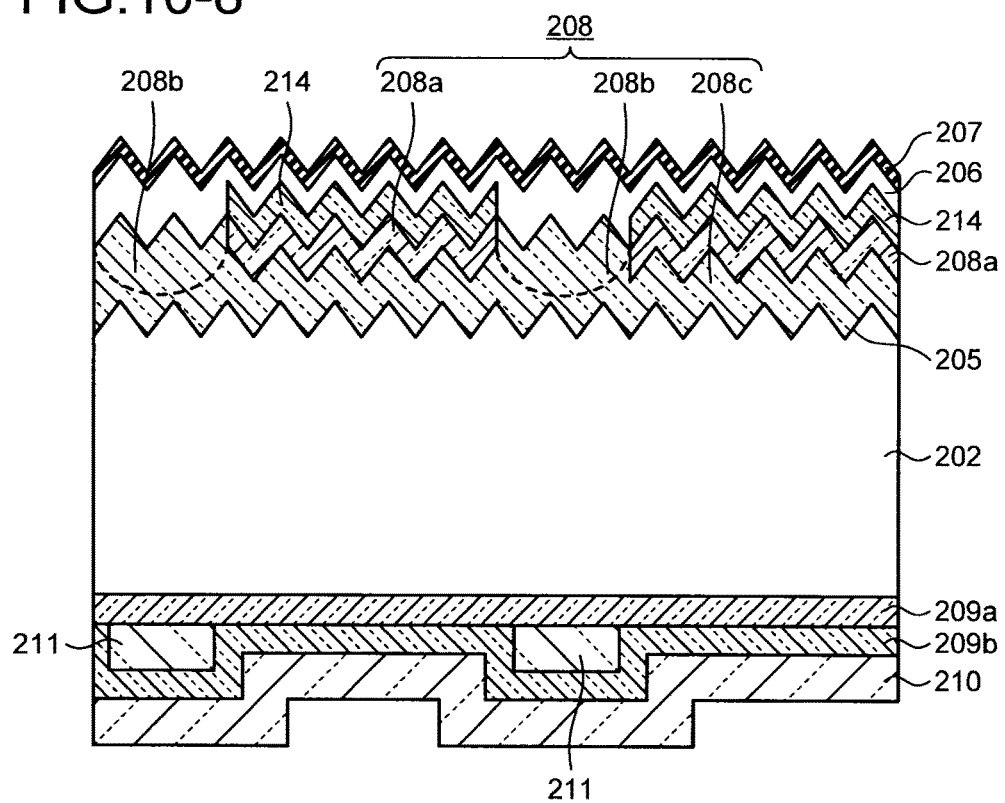
Figures 9, 10:
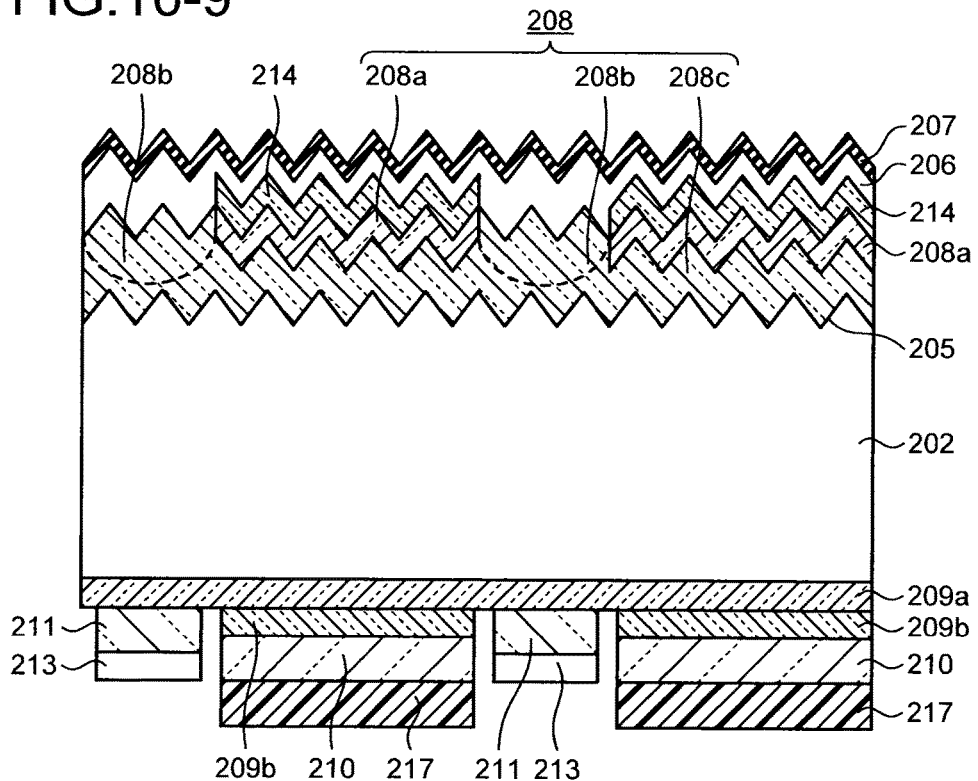
Figure 10:
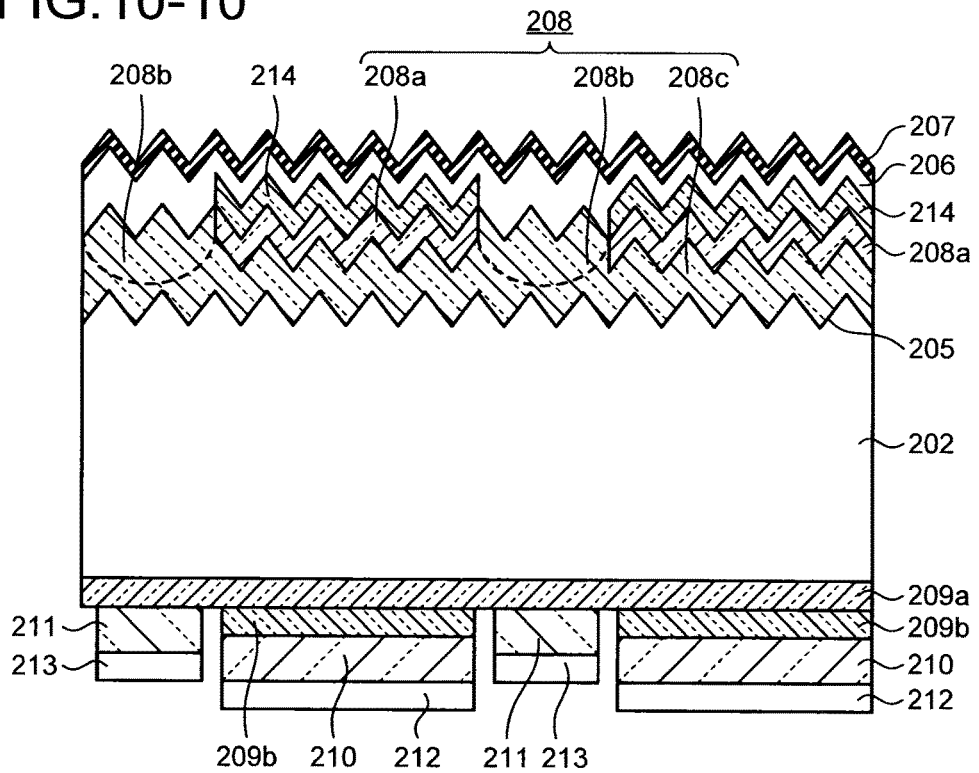
Figures 10, 11:
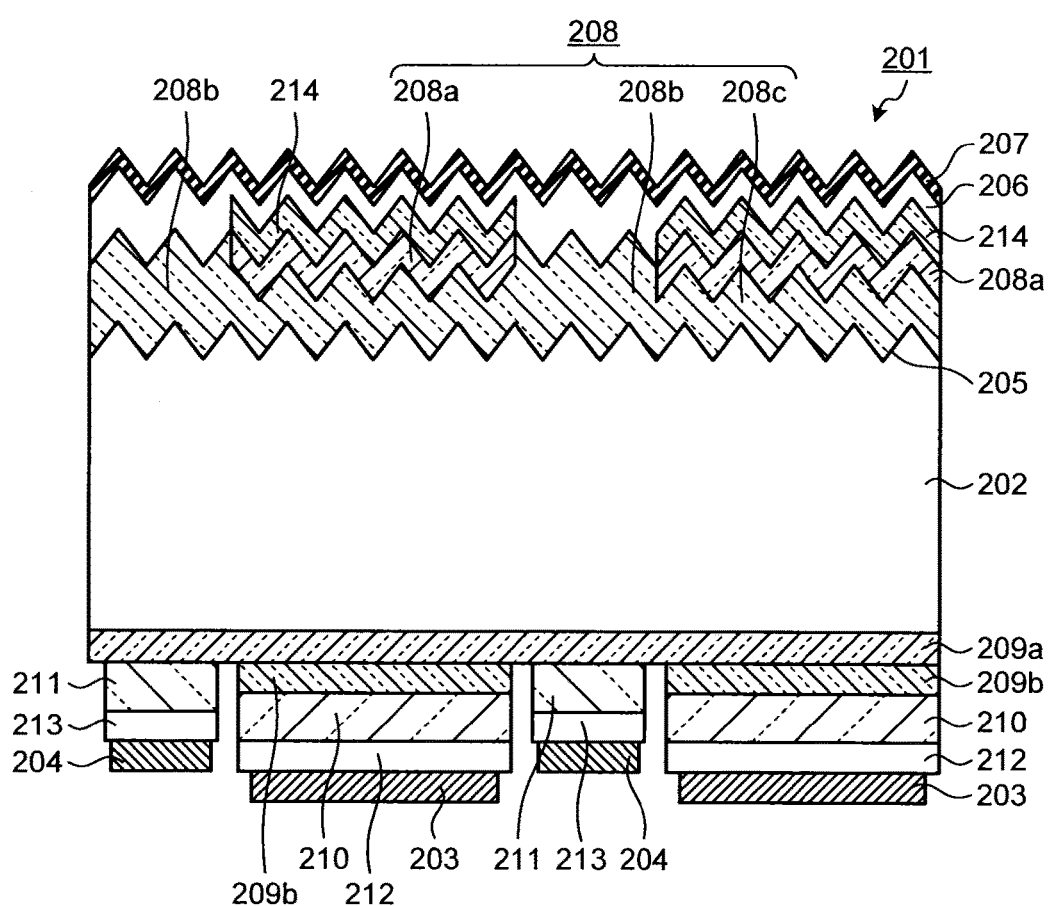

Next, the manufacturing method of the photoelectric conversion device 201 according to the third embodiment will be explained. FIG. 10-1 to FIG. 10-11 are cross-sectional views explaining the procedure of the manufacturing method of the photoelectric conversion device 201 according to the third embodiment. First, as illustrated in FIG. 10-1, the texture structure 205 composed of microasperities, called a texture, is formed on the light receiving surface side of the n-type crystalline silicon substrate 202. The microasperities are formed by using acid or alkaline etching solution. At this point, the other surface side of the n-type crystalline silicon substrate 202 is covered with resin, such as a resist, a dielectric film, or the like so that the texture structure is not formed on the other surface side of the n-type crystalline silicon substrate 202. Before the microasperities are formed, the process of removing the damaged layer on the surface of the n-type crystalline silicon substrate 202 may be performed. In addition to the above, after the process of removing the damaged layer, it is desirable to perform a gettering process of the impurity in the n-type crystalline silicon substrate 202 in order to improve the performance of the photoelectric conversion device. For example, a phosphorus diffusion process is used as the gettering process.

After the texture structure 205 is formed, as illustrated in FIG. 10-2, a phosphorus diffusion source 215 is formed on the surface on the light receiving surface side of the n-type crystalline silicon substrate 202, on which the texture structure 205 is formed, and a heat treatment is performed. Accordingly, phosphorus (P) is diffused into the surface on the light receiving surface side of the n-type crystalline silicon substrate 202 from the phosphorus diffusion source 215 and thus the n-type semiconductor region 208c is formed in the surface layer on the light receiving surface side of the n-type crystalline silicon substrate 202. At this point, the concentration of phosphorus (P) diffused into the surface on the light receiving surface side of the n-type crystalline silicon substrate 202 can be controlled by adjusting the temperature and the treatment time of the heat treatment. In the n-type semiconductor region 208c, the maximum impurity concentration is approximately $1 \times 10^{16}$ $cm^{-3}$ and the average impurity concentration is approximately $0.5 \times 10^{16}$ $cm^{-3}$. Thereafter, the phosphorus diffusion source 215 is removed.

Next, as illustrated in FIG. 10-3, on the surface on the light receiving surface side (the n-type semiconductor region 208c), the n-type semiconductor layer 214 is formed in the region opposed to the region in which the p-type semiconductor layer 210 is to be formed on the back surface side of the n-type crystalline silicon substrate 202. For example, an amorphous silicon film or a microcrystalline silicon film, doped with phosphorus (P), is used as the n-type semiconductor layer 214. For example, the average doping concentration of the n-type semiconductor layer 214 is preferably approximately $1\times10^{22}$ to $1\times10^{23}$ cm$^{-3}$. An intrinsic amorphous silicon film with a thickness of approximately a few nm may be inserted between the n-type semiconductor layer 214 and the n-type crystalline silicon substrate 202 (the n-type semiconductor region 208c). In such a case, the total film thickness of the n-type semiconductor layer 214 and the intrinsic amorphous silicon film is preferably 5 nm or more and 20 nm or less in order to suppress light absorption in these films. When the n-type semiconductor layer 214 is formed, for example, an amorphous silicon film or a microcrystalline silicon film, doped with phosphorus (P), is formed as the n-type semiconductor layer 214 over the entire surface on the light receiving surface side of the n-type crystalline silicon substrate 202. Then, after the region in this silicon film opposed to the region in which the p-type semiconductor layer 210 is to be formed is covered with a resist, unnecessary portions of the silicon film are removed by etching using the resist as a mask. Thereafter, the resist is removed. Accordingly, the n-type semiconductor layer 214 is formed on the surface on the light receiving surface side of the n-type crystalline silicon substrate 202 (on the n-type semiconductor region 208c).

Next, in order to diffuse phosphorus (P) into the n-type crystalline silicon substrate 202 from the n-type semiconductor layer 214, a heat treatment (phosphorus diffusion process) is performed at a temperature of, for example, 200° C. or higher. Accordingly, phosphorus (P) is diffused into the surface on the light receiving surface side of the n-type crystalline silicon substrate 202 (the n-type semiconductor region 208c) and thus the n-type semiconductor region 208a is formed in the region opposed to the region in which the p-type semiconductor layer 210 is to be formed as illustrated in FIG. 10-4. At this point, the concentration of phosphorus (P) diffused into the surface on the light receiving surface side of the n-type crystalline silicon substrate 202 is controlled by adjusting the temperature and the treatment time of the heat treatment, thereby making the phosphorus (P) concentration of the n-type semiconductor region 208a larger than that of the n-type semiconductor region 208c. On the surface on the light receiving surface side of the n-type crystalline silicon substrate 202 (the n-type semiconductor region 208c), in the region opposed to the region in which the n-type semiconductor layer 211 is to be formed, phosphorus (P) is not diffused because this region is not covered with the n-type semiconductor layer 214 and the n-type semiconductor region 208c remains unchanged. The region between the adjacent n-type semiconductor regions 208a in the plane direction of the n-type crystalline silicon substrate 202 becomes the n-type semiconductor region 208b. Therefore, the n-type semiconductor region 208b and the n-type semiconductor region 208c have the same phosphorus (P) concentration. Accordingly, in the n-type semiconductor region 208a, the maximum impurity concentration is approximately $1\times10^{18}$ cm$^{-3}$ and the average impurity concentration is approximately $0.5\times10^{18}$ cm$^{-3}$. In the n-type semiconductor region 208b and the n-type semiconductor region 208c, the maximum impurity concentration is approximately $1\times10^{16}$ cm$^{-3}$ and the average impurity concentration is approximately $0.5\times10^{16}$ cm$^{-3}$. Because the n-type semiconductor layer 214 serves also as a passivation film, the n-type semiconductor layer 214 is not removed after the diffusion of phosphorus. Because another passivation film is formed as will be described later, the n-type semiconductor layer 214 may be removed.

Next, as illustrated in FIG. 10-5, the passivation film 206 and the anti-reflective film 207 are formed, in the order they appear in this sentence, on the surface on the light receiving surface side of the n-type crystalline silicon substrate 202 having the texture structure 205 by using a chemical vapor deposition (CVD) method such that they cover the n-type semiconductor layer 214 and the n-type semiconductor region 208b. For example, a silicon oxide film, a silicon nitride film, or the like is used as the passivation film 206. An n-type amorphous silicon film, an n-type microcrystalline silicon thin film, or the like having the same conductivity type as that of the n-type crystalline silicon substrate 202 may be used as the passivation film 206. Furthermore, a laminated film of an intrinsic amorphous silicon film and an n-type amorphous silicon film or an n-type microcrystalline silicon film may be used as the passivation film 206. The film thickness of the passivation film 206 at this point is preferably 5 nm or more and 20 nm or less in order to suppress light absorption in the passivation film 206. It is advisable to use a plasma CVD method, a thermal CVD method, or the like as the CVD method. For example, a silicon oxide film, a silicon nitride film, or a laminated film thereof is used as the anti-reflective film 207. When the passivation film 206 is a silicon oxide film or a silicon nitride film, this film may also serve as an anti-reflective film.

Next, as illustrated in FIG. 10-6, the passivation film 209a and the n-type semiconductor layer 211 are formed, in the order they appear in this sentence, on the back surface side of the n-type crystalline silicon substrate 202, on which the texture structure 205 is not formed. For example, an intrinsic amorphous silicon film, an intrinsic microcrystalline silicon film, or the like is used as the passivation film 209a. For example, an amorphous silicon film or a microcrystalline silicon film, doped with phosphorus (P), is used as the n-type semiconductor layer 211. The film thickness of the n-type semiconductor layer 211 is preferably 20 nm or less in order to suppress optical loss in the n-type semiconductor layer 211. At this point, before the passivation film 209a is formed, it is preferable to clean the back surface of the n-type crystalline silicon substrate 202 with hydrofluoric acid (HF), hydrochloric acid (HCL) to which hydrogen peroxide solution ($H_2O_2$) is added, ammonia ($NH_3$) solution, or the like. The film thickness of the passivation film 209a is, for example, preferably 2 nm to 5 nm.

After the passivation film 209a and the n-type semiconductor layer 211 are formed, as illustrated in FIG. 10-7, necessary portions of the n-type semiconductor layer 211 are covered with a resist 216 and unnecessary portions of the n-type semiconductor layer 211 are removed. The plane arrangement pattern of the resist 216 at this point is of such a shape that the width thereof is larger by approximately 50 μm to 100 μm than that of the pattern of the collecting electrode 204 as illustrated in FIG. 8-2. As a method of removing the unnecessary portions of the n-type semiconductor layer 211, for example, wet etching, plasma etching, etching paste, or the like is used. At this point, the passivation film 209a is prevented from being removed. Thereafter, the resist 216 is removed. Instead of covering the necessary portions of the n-type semiconductor layer 211 with the resist 216 and performing etching, the unnecessary portions of the n-type semiconductor layer 211 may be removed by printing etching paste on the unnecessary portions of the n-type semiconductor layer 211.

Next, as illustrated in FIG. 10-8, the passivation film 209b and the p-type semiconductor layer 210 doped with boron (B) are formed, in the order they appear in this sentence, on the back surface side of the n-type crystalline silicon substrate 202. For example, an intrinsic amorphous silicon film, an intrinsic microcrystalline silicon film, or the like is used as the passivation film 209b. An amorphous silicon film doped with boron (B) or a microcrystalline silicon film doped with boron (B) is used as the p-type semiconductor layer 210. The film thickness of the passivation film 209b is, for example, preferably 2 nm to 5 nm. In addition to this, the film thickness of the p-type semiconductor layer 210 is preferably 10 nm or less in order to suppress optical loss in the p-type semiconductor layer 210.

After the passivation film 209b and the p-type semiconductor layer 210 are formed, as illustrated in FIG. 10-9, necessary portions of the p-type semiconductor layer 210 are covered with a resist 217 and unnecessary portions of the passivation film 209b and the p-type semiconductor layer 210 are removed. The plane arrangement pattern of the resist 217 at this point is of such a shape that the width thereof is larger by approximately 50 μm to 100 μm than that of the pattern of the collecting electrode 203 as illustrated in FIG. 8-2. As a method of removing the unnecessary portions of the passivation film 209b and the p-type semiconductor layer 210, for example, wet etching, plasma etching, etching paste, or the like is used. At this point, the n-type semiconductor layer 211 and the passivation film 209a are prevented from being removed. Thereafter, the resist 217 is removed. Instead of covering the necessary portions of the p-type semiconductor layer 210 with the resist and performing etching, the unnecessary portions of the passivation film 209b and the p-type semiconductor layer 210 may be removed by printing etching paste on the unnecessary portions of the p-type semiconductor layer 210.

Next, a transparent conductive film is formed on the back surface side of the n-type crystalline silicon substrate 202 by a sputtering method or the like. Thereafter, the transparent conductive film other than that in the regions on the p-type semiconductor layer 210 and the n-type semiconductor layer 211 is removed by using etching paste. Accordingly, as illustrated in FIG. 10-10, the transparent electrode 212 is formed on the p-type semiconductor layer 210 and the transparent electrode 213 is formed on the n-type semiconductor layer 211. As the transparent conductive film, for example, indium oxide ($In_2O_3$: Indium Oxide), indium oxide doped with tin (ITO: Indium Tin Oxide), zinc oxide (ZnO: Zinc Oxide), or the like is used. Before the transparent conductive film is formed, a heat treatment may be performed on the n-type crystalline silicon substrate 202 at a temperature of approximately 200° C. in order to improve the defect passivation effect of the passivation film.

Next, as illustrated in FIG. 10-11, the collecting electrode 203 is formed on the transparent electrode 212 and the collecting electrode 204 is formed on the transparent electrode 213. The collecting electrode 203 and the collecting electrode 204 are formed by printing, for example, silver (Ag) paste. The collecting electrode 203 and the collecting electrode 204 may be formed by metal plating using copper (Cu) or the like instead of silver paste (Ag). By performing the processes described above, the photoelectric conversion device 201 according to the third embodiment having the configuration illustrated in FIG. 8-1 to FIG. 8-3 is obtained. The forming of the light receiving surface side and the back surface side of the photoelectric conversion device 201 may be performed in the opposite order.

As described above, in the photoelectric conversion device 201 according to the third embodiment, the average impurity concentration of the n-type semiconductor region 208b is made lower than that of the n-type semiconductor region 208a. The n-type semiconductor region 208b is an FSF region that does not contribute to the transfer of the charge generated in the substrate surface on the light receiving surface side of the n-type crystalline silicon substrate 202 and is provided at the position opposed to the n-type semiconductor layer 211 with the n-type crystalline silicon substrate 202 therebetween. Typically, when the impurity concentration of a semiconductor is reduced, the charge loss due to recombination is reduced. In the photoelectric conversion device 201, the average impurity concentration of the n-type semiconductor region 208b is reduced; therefore, the charge loss due to recombination in the n-type semiconductor region 208b is reduced. In contrast, while the n-type semiconductor region 208a, which is an FSF region provided at the position opposed to the p-type semiconductor layer 210, has a role of conducting the generated charge to the n-type semiconductor layer 211, the charge generated in the n-type semiconductor region 208b and near the n-type semiconductor region 208b is conducted only in the direction substantially vertical to the substrate surface; therefore, the n-type semiconductor region 208b does not contribute to the charge conduction. Accordingly, in the photoelectric conversion device 201, the power generation current is increased while maintaining the conduction of the charge by the FSF region; therefore, a photoelectric conversion device having a high photoelectric conversion efficiency is realized.

Moreover, in the photoelectric conversion device 201 according to the third embodiment, the average impurity concentration of the n-type semiconductor region 208c, which is below the n-type semiconductor region 208a, is made lower than that of the n-type semiconductor region 208a. Accordingly, it is possible to suppress reduction in the photoelectric conversion efficiency due to light absorption in the FSF region. For example, the reduction in the photoelectric conversion efficiency due to light absorption in the FSF region can be suppressed compared with the case of the first embodiment by making the thickness of the FSF region the same as that in the case of the first embodiment and making the thickness of the n-type semiconductor region 208a less than that of the n-type semiconductor region 8a in the first embodiment. Accordingly, in the photoelectric conversion device 201, the power generation current is increased while maintaining the conduction of the charge by the FSF region; therefore, a photoelectric conversion device having a high photoelectric conversion efficiency is realized.

Thus, according to the third embodiment, an effect is obtained where it is possible to realize a back-contact photoelectric conversion device that offers high power generation current and has excellent photoelectric conversion efficiency.

An embodiment may be such that any arbitrary structures in the first to third embodiments are combined.

A photoelectric conversion module that has excellent photoelectric conversion efficiency can be realized by forming a plurality of photoelectric conversion devices having the configurations explained in the above embodiments and electrically connecting adjacent photoelectric conversion devices in series or in parallel. In such a case, for example, it is satisfactory to electrically connect the collecting electrode on the p-type semiconductor layer of one of the adjacent photoelectric conversion devices and the collecting electrode on the n-type semiconductor layer of the other of the adjacent photoelectric conversion devices.

INDUSTRIAL APPLICABILITY

As described above, the photoelectric conversion device according to the present invention is useful for realizing a back-contact photoelectric conversion device that has excellent photoelectric conversion efficiency.

REFERENCE SIGNS LIST 1 photoelectric conversion device, 2 n-type crystalline silicon substrate, 3 collecting electrode, 4 collecting electrode, 5 texture structure, 6 passivation film, 7 anti-reflective film, 8 n-type semiconductor region, 8a n-type semiconductor region, 8b n-type semiconductor region, 9a passivation film, 9b passivation film, 10 p-type semiconductor layer, 11 n-type semiconductor layer, 12 transparent electrode, 13 transparent electrode, 14 protective film, 15 phosphorus diffusion source, 16 phosphorus diffusion source, 17 resist, 18 resist, 101 photoelectric conversion device, 102 n-type crystalline silicon substrate, 103 collecting electrode, 104 collecting electrode, 105 texture structure, 106 passivation film, 107 anti-reflective film, 108 n-type semiconductor region, 108a n-type semiconductor region, 108b n-type semiconductor region, 109a passivation film, 109b passivation film, 110 p-type semiconductor layer, 111 n-type semiconductor layer, 112 transparent electrode, 113 transparent electrode, 114 phosphorus diffusion source, 117 resist, 118 resist, 201 photoelectric conversion device, 202 n-type crystalline silicon substrate, 203 collecting electrode, 204 collecting electrode, 205 texture structure, 206 passivation film, 207 anti-reflective film, 208, 208a, 208b, 208c n-type semiconductor region, 209a, 209b passivation film, 210 p-type semiconductor layer, 211 n-type semiconductor layer, 212 transparent electrode, 213 transparent electrode, 214 n-type semiconductor layer, 215 phosphorus diffusion source, 216 resist, 217 resist, A solar light, F solar light, L solar light, N solar light.

The invention claimed is:

1. A photoelectric conversion device comprising:
a first-conductivity-type semiconductor substrate;
a first-conductivity-type first semiconductor layer, a second-conductivity-type second semiconductor layer, a first electrode formed on the first-conductivity-type first semiconductor layer,
and a second electrode formed on the second-conductivity-type second semiconductor layer, wherein the first-conductivity-type first semiconductor layer, the second-conductivity-type second semiconductor layer, the first electrode, and the second electrode all formed on a back surface opposite to a light receiving surface of the first-conductivity-type semiconductor substrate; and
a first-conductivity-type semiconductor region on a surface on a light receiving surface side of the first-conductivity-type semiconductor substrate, wherein
the first-conductivity-type semiconductor region includes a first region that is directly opposed to the first-conductivity-type first semiconductor layer in a thickness direction of the photoelectric conversion device with the first-conductivity-type semiconductor substrate therebetween and a second region that is directly opposed to the second-conductivity-type second semiconductor layer in the thickness direction with the first-conductivity-type semiconductor substrate therebetween,
the first region and the second region have different average impurity concentrations, and
an average impurity concentration of the first region is lower than an average impurity concentration of the second region.

2. The photoelectric conversion device according to claim 1, wherein the first region and the second region have approximately same thickness.

3. The photoelectric conversion device according to claim 2, wherein
the second region is formed by laminating a first layer and a second layer,
the first layer has an average impurity concentration equivalent to that of the first region,
the first layer is arranged on a back surface side of the first-conductivity-type semiconductor region in a thickness direction of the first-conductivity-type semiconductor region,
the second layer has an average impurity concentration higher than that of the first layer, and
the second layer is arranged on a light receiving surface side of the first-conductivity-type semiconductor region in the thickness direction of the first-conductivity-type semiconductor region.

4. The photoelectric conversion device according to claim 1, wherein an impurity penetration depth of the first region is shallower than an impurity penetration depth of the second region.

5. The photoelectric conversion device according to claim 1, further comprising a third semiconductor layer having an impurity concentration lower than that of the first-conductivity-type first semiconductor layer and the second-conductivity-type second semiconductor layer,
wherein the third semiconductor layer is formed between the first-conductivity-type first semiconductor layer and the first-conductivity-type semiconductor substrate, and between the second-conductivity-type second semiconductor layer and the first-conductivity-type semiconductor substrate.

6. The photoelectric conversion device according to claim 1, wherein a first-conductivity-type fourth semiconductor layer is formed on the surface on the light receiving surface side of the first-conductivity-type semiconductor substrate.

7. The photoelectric conversion device according to claim 1, wherein a dielectric layer is formed on the surface on the light receiving surface side of the first-conductivity-type semiconductor substrate.

8. The photoelectric conversion device according to claim 7, wherein the dielectric layer is formed of silicon oxide or silicon nitride.

9. The photoelectric conversion device according to claim 1, wherein the first-conductivity-type first semiconductor layer and the second-conductivity-type second semiconductor layer are alternately arranged on the back surface of the first-conductivity-type semiconductor substrate.

10. The photoelectric conversion device according to claim 1, further comprising a transparent electrode between the first-conductivity-type first semiconductor layer and the first electrode and between the second-conductivity-type second semiconductor layer and the second electrode.

11. A photoelectric conversion module, wherein at least two or more of the photoelectric conversion devices according to claim 1 are electrically connected in series or parallel.

12. The photoelectric conversion device according to claim 1, further comprising a first passivation film formed between the first-conductivity-type first semiconductor layer and the first-conductivity-type semiconductor substrate and between the second-conductivity-type second semiconductor layer and the first-conductivity-type semiconductor substrate.

13. The photoelectric conversion device according to claim 12, further comprising a second passivation film formed between the second-conductivity-type second semiconductor layer and the first-conductivity-type semiconductor substrate.

* * * * *